United States Patent [19]

Holst et al.

[11] Patent Number: 5,955,037
[45] Date of Patent: Sep. 21, 1999

[54] EFFLUENT GAS STREAM TREATMENT SYSTEM HAVING UTILITY FOR OXIDATION TREATMENT OF SEMICONDUCTOR MANUFACTURING EFFLUENT GASES

[75] Inventors: Mark Holst, Concord, Calif.; Kent Carpenter, Stamford, Conn.; Scott Lane, Chandler, Ariz.; Prakash V. Arya, New York, N.Y.

[73] Assignee: ATMI Ecosys Corporation, San Jose, Calif.

[21] Appl. No.: 08/775,838

[22] Filed: Dec. 31, 1996

[51] Int. Cl.⁶ ................................................... B01D 53/34
[52] U.S. Cl. ........................ 422/171; 422/172; 422/173; 422/174; 55/223; 55/257.1; 55/431; 55/522; 406/46; 406/48; 406/193
[58] Field of Search ................................... 422/171–172, 422/177, 221, 222, 180, 173–174, 199; 423/240 R, 210; 431/5, 7, 353, 10, 351, 281; 55/223, 233, 240, 242, 257.1, 261, 259, 266, 431, 466, 522, 523, DIG. 32; 406/46–48, 89, 172, 193; 95/211, 214, 223, 224, 279–281

[56] References Cited

U.S. PATENT DOCUMENTS

| | | | |
|---|---|---|---|
| 3,898,040 | 8/1975 | Tabak | 431/5 |
| 4,083,607 | 4/1978 | Mott | 55/467 |
| 4,236,464 | 12/1980 | Anderson et al. | 422/139 |
| 4,719,088 | 1/1988 | Itoh et al. | 422/168 |
| 4,801,437 | 1/1989 | Konagaya et al. | 422/170 |
| 5,009,869 | 4/1991 | Weinberg et al. | 423/210 |
| 5,113,789 | 5/1992 | Kamian | 118/715 |
| 5,118,286 | 6/1992 | Sarin | 432/2 |
| 5,160,707 | 11/1992 | Murray et al. | 422/170 |
| 5,252,007 | 10/1993 | Klinzing et al. | 406/14 |
| 5,533,890 | 7/1996 | Holst et al. | 422/177 |
| 5,575,636 | 11/1996 | Kobayashi et al. | 431/8 |
| 5,599,508 | 2/1997 | Martinelli et al. | 422/169 |

FOREIGN PATENT DOCUMENTS 9616720  6/1996  WIPO .

OTHER PUBLICATIONS

Abrea, et al., Causes of anomalous solid formation in the exhaust system of low–pressure chemical vapor deposition plasma enhanced chemical vapor deposition semiconductor processes, J. Vac. Sci. Technol B 12(4) Jul./Aug. 1994, pp. 2763/2767.

*Primary Examiner*—Hien Tran
*Attorney, Agent, or Firm*—Steven J. Hultquist; Oliver A. M. Zitzmann

[57] ABSTRACT

An effluent gas stream treatment system for treatment of gaseous effluents such as waste gases from semiconductor manufacturing operations. The effluent gas stream treatment system comprises a pre-oxidation treatment unit, which may for example comprise a scrubber, an oxidation unit such an electrothermal oxidizer, and a post-oxidation treatment unit, such as a wet or dry scrubber. The effluent gas stream treatment system of the invention may utilize an integrated oxidizer, quench and wet scrubber assembly, for abatement of hazardous or otherwise undesired components from the effluent gas stream. Gas or liquid shrouding of gas streams in the treatment system may be provided by high efficiency inlet structures.

49 Claims, 14 Drawing Sheets

EFFLUENT GAS STREAM TREATMENT SYSTEM HAVING UTILITY FOR OXIDATION TREATMENT OF SEMICONDUCTOR MANUFACTURING EFFLUENT GASES

BACKGROUND OF THE INVENTION

1. Field of the Invention

The present invention relates to a system for the treatment of industrial effluent fluids such as effluent gases produced in semiconductor manufacturing, photovoltaic processing, etc. Such system may variously include an oxidizer, gas scrubbing, particulate solids removal, and other unit operations for effluent gas treatment.

2. Description of the Related Art

In the treatment of industrial fluid waste streams, a wide variety of unit operations and corresponding discrete treatment apparatus have been integrated for processing of the effluent from an upstream process facility.

For example, various integrated thermal systems are commercially available for treatment of semiconductor manufacturing effluents and photovoltaic processing off-gases. These integrated systems are typically targeted for use with CVD, metal etch, etch and ion implant tools. Commercial integrated systems include the Delatech Controlled Decomposition Oxidizer (CDO), the Dunnschicht Anlagen Systeme (DAS) Escape system, and the Edwards Thermal Processing Unit (TPU). Each of these commercially available systems consists of an integration of a thermal processing unit for oxidative decomposition of effluent gases, combined with a wet quench for temperature control of the off-gases from the hot oxidation section, and a wet scrubbing system for the removal of acid gases and particulates formed in the oxidation process.

In the Delatech CDO, the thermal system comprises an electrically heated tube, which may optionally be combined with a flame-based insertable Hydrogen Injection System (HIS) for the destruction of particularly difficult-to-remove compounds from the effluent gas stream. In the aforementioned DAS Escape system, the thermal oxidizer is flame-based, using $O_2$ as the oxidizer and methane or hydrogen as the fuel. In the TPU, the thermal oxidizer comprises a flame-based surface combustion unit which uses air or $O_2$ as oxidizer and methane as a fuel.

In addition to these integrated commercial systems, there are also various commercially available stand-alone single unit operational systems for the treatment of effluent gas streams, including: a) unheated physisorptive packed bed dry scrubbers, b) unheated chemisorptive packed bed dry scrubbers, c) heated chemically reacting packed bed dry scrubbers, d) heated catalytically reacting packed bed dry scrubbers, e) wet scrubbers, and f) flame-based thermal treatment units. Each of these unit operation technologies is appropriate for certain applications, depending on the nature of the gas stream undergoing treatment.

In general, each of these respective technologies is based on a distinct set of removal mechanisms for specific effluent stream constituents. These technologies can provide excellent abatement when either: a) the effluent stream constituents requiring removal are sufficiently similar in removal mechanism pathway that a single removal technology can eliminate the gases of concern, or b) when the particular subset of gas stream constituent species that is not responsive to that particular removal mechanism is of such character that the gas stream constituent species can be vented without abatement.

On occasion, the end user of the aforementioned stand-alone single unit operationally-based systems may choose to combine two or more of these various treatment units in order to provide a processing sequence for each of the categories of the various gases being passed through the system. Nonetheless, the execution of such a consolidated equipment approach is clearly less convenient for the end user than for the original equipment manufacturer, since the original equipment manufacturer can provide an integration of the various operational treatment units in a single small-sized treatment system in the first instance. The end user, by contrast, must substantially modify the component stand-alone units for consolidated assembly and operation.

Additionally, while these original equipment manufacturer-integrated effluent gas stream treatment systems clearly can, in certain applications, have advantages over single unit operational systems, typically, these integrated systems, which may for example carry out unit operations of oxidation, quenching, and scrubbing, suffer from various deficiencies, including: particulates clogging in the respective sections as well as the inlet region of the oxidizer section, generation of particulates in the oxidation section, poor scrubbing of acid gases in the scrubber section, high consumption of water for acid gas and particulate scrubbing, and condensation of saturated off-gases from the scrubber section resulting in collection and concentration of aqueous mixtures with acids.

Inlet clogging can arise from several sources including: (a) back-migration of water vapor as combustion products of the oxidizer section, causing hydrolysis reactions in a heterogeneous or homogeneous fashion with incoming water-sensitive gases such as $BCl_3$ or $WF_6$; (b) thermal degradation of incoming thermally-sensitive gases; and (c) condensation of incoming gases due to transition points in the system. These inlet clogging problems may require the incorporation of plunger mechanisms or other solids removal means to keep the inlet free of solids accumulations, however these mechanical fixes add considerable expense and labor to the system. In other instances, the inlet clogging problems may be systemic and require periodic preventative maintenance to keep the inlet free of solids accumulations. Such maintenance, however, requires shut-down of the system and loss of productivity in the manufacturing facility.

The existing integrated point of use gas effluent treatment systems may also experience problems in plant facilities which have difficulty in treating the wastewater from their wet scrubbing processes. A number of plants may have difficulties processing the fluorine ($F^-$) species in the wastewater generated from these point of use systems, or more generally, in processing wastewater deriving from the gas effluent treatment system per se.

The water scrubber and quench portions of the integrated system can also have problems with clogging when quality of the feed water available to the process facility is poor, a typical condition in the Southwest United States. Lack of readily available water, high water costs, and high disposal costs for discharged wastewater are also significant problems in many localities. In some cases, these factors necessitate the use of high quality deionized water in the process facility to prevent clogging problems. While effective in preventing the scrubber and quench plugging, such solution involves a very high cost of ownership associated with the substantial costs of high quality deionized water.

In the scrubbing operation, poor scrubbing of acid gases in scrubber towers can be due to the small flowrates that are processed through these systems. The diameters of scrubber towers processing such small flowrates are correspondingly small, which when combined with the use of conventional large diameter packing can result in a packing element diameter to column diameter which is excessively high and results in large wall effects in the scrubber tower. Such scrubber towers as a result require large water flows, which in turn can cause channeling, flooding and slugging, with pockets of process gas passing untreated through the scrubber system. Due to the poor scrubbing of these systems, corrosion in the ducting downstream of these systems is commonly observed, which is due to condensation of the untreated off-gases from the scrubber. When halide gases are being treated in the effluent stream, the off-gases from the scrubber tower will as a result of the poor scrubbing performance of the scrubber contain unscrubbed halogen content. The unscrubbed halogen content may result in formation of pools of highly concentrated acids condensed at the volatile liquid evaporation (VLE) dewpoint condition, and a substantially higher than expected acid/water mix.

It is an object of the invention to provide an improved system for the treatment of industrial effluent gases.

It is an object of the present invention to provide an improved integrated effluent processing system, utilizing water scrubbing and oxidation treatment of the effluent gas stream.

It is a further object of the invention to provide an improved system for the treatment of industrial effluent gases, which reduces the susceptibility to clogging and solids accumulations in the system.

It is a still further object of the invention to provide an effluent gas treatment system utilizing water scrubbing, which substantially reduces the water required in the scrubbing operation, relative to scrubber systems of the prior art.

It is another object of the invention to provide such a system for the treatment of effluent gases such as are produced in the manufacture of semiconductors, photovoltaic processing, and the like, which overcome the above-discussed deficiencies of the prior art systems.

Other objects and advantages will be more fully apparent from the ensuing disclosure.

SUMMARY OF THE INVENTION

The present invention relates to an integrated effluent gas treatment system, having utility for the point of use treatment of industrial gas effluents, e.g., those produced in the manufacture of semiconductor materials and devices.

In one aspect, the integrated effluent gas treatment system of the present invention is configured to include, for example in a unitary housing as a compact point of use device, some or all of the following system components:

(i) a pre-treatment unit for acid gas and particulate removal (e.g., a (pre)scrubber);

(ii) an electrothermal oxidizer or other oxidizer unit;

(iii) an oxidizer exhaust gas quenching unit;

(iv) an acid gas scrubber unit;

(v) gas flow-inducing means, such as an active motive flow means (blower, fan, pump, etc.) or passive flow means (eductor, ejector, aspiration nozzle, etc.); and (vi) associated control means, which may for example include influent gas temperature control means (e.g., including a heat-traced foreline, heat exchanger, or other means for ensuring appropriate thermal characteristics of the gas flowed through the integrated system), power supply means (surge protection, uninterruptable power supply (UPS) connection or dedicated UPS components, etc.), and other process control elements and subassemblies, for monitoring and selectively adjusting the process conditions (temperatures, pressures, flow rates, and compositions) in the system during its operation.

The integrated effluent gas treatment system of the present invention may utilize a pre-scrubber, oxidizer, and scrubber assembly, in combination with a clog-resistant inlet structure for introducing a fluid stream to the assembly from an upstream process facility.

Such clog-resistant inlet structure in one embodiment comprises first and second generally vertically arranged flow passage sections in serial coupled relationship to one another, defining in such serial coupled relationship a generally vertical flow passage through which the particulate solids-containing fluid stream may be flowed, from an upstream source of the particulate solids-containing fluid to a downstream fluid processing system arranged in fluid stream-receiving relationship to the inlet structure.

The first flow passage section is an upper section of the inlet structure and includes an inner gas-permeable wall which may be formed of a porous metal or porous ceramic, or other suitable material of construction, enclosing a first upper part of the flow passage. The gas-permeable inner wall has an interior surface bounding the upper part of the flow passage.

The gas-permeable wall is enclosingly surrounded by an outer wall in spaced apart relationship to the gas-permeable inner wall. The outer wall is not porous in character, but is provided with a low pressure gas flow port. By such arrangement, there is formed between the respective inner gas-permeable wall and outer enclosing wall an interior annular volume.

The low pressure gas flow port in turn may be coupled in flow relationship to a source of low pressure gas for flowing such gas at a predetermined low rate, e.g., by suitable valve and control means, into the interior annular volume, for subsequent flow of the low pressure gas from the interior annular volume into the flow passage. A high pressure gas flow port optionally may also be provided in the outer wall of the first flow passage section, coupled in flow relationship to a source of high pressure gas for intermittent flowing of such gas into the interior annular volume, such high pressure gas flow serving to clean the inner gas-permeable wall of any particulates that may have deposited on the inner surface thereof (bounding the flow passage in the first flow passage section). The high pressure gas may likewise be controllably flowed at the desired pressure by suitable valve and control means.

The second flow passage section is serially coupled to the first flow passage section, for flowing of particulate solids-containing fluid downwardly into the second flow passage section from the first flow passage section. The second flow passage includes an outer wall having a liquid injection port therein, which may be coupled with a source of liquid such as water or other process liquid. The outer wall is coupleable with the first flow passage section, such as by means of matable flanges on the respective outer walls of the first and second flow passage sections. The second flow passage includes an inner weir wall in spaced apart relationship to the outer wall to define an interior annular volume therebetween, with the inner weir wall extending toward but stopping short of the inner gas-permeable wall of the first flow passage section, to provide a gap between such respective inner walls of the first and second flow passage sections, defining a weir. When liquid is flowed into the interior annular volume between the outer wall of the second flow passage section and the inner wall thereof, the introduced liquid overflows the weir and flows down the interior surface of the inner wall of the second flow passage section. Such flow of liquid down the inner wall serves to wash any particulate solids from the wall and to suppress the deposition or formation of solids on the interior wall surface of the inner wall.

The flanged connection of the first and second flow passage sections with one another may include a quick-release clamp assembly, to accommodate ready disassembly of the respective first and second flow passage sections of the inlet structure.

Further, the first flow passage section of the inlet structure may be joined to an uppermost inlet structure quick-disconnect inlet section, which likewise may be readily disassembled for cleaning and maintenance purposes.

In another aspect, the invention relates to an effluent gas treatment system comprising a pre-scrubber for removal of acid gases and particulates from the effluent gas, an oxidizer for oxidation treatment of oxidizable components in the effluent gas stream and a subsequent water scrubber for scrubbing the effluent gas stream subsequent to oxidation treatment thereof. In such pre-scrubbing/oxidation/scrubbing system, a gas/liquid interface structure may be employed, which is resistant to deposition of solids, clogging and corrosion, when a hot, particulate-laden gas stream containing corrosive components, as discharged by the oxidizer, is received by such gas/liquid interface structure. Such gas/liquid interface structure comprises:

a first vertically extending inlet flow passage member defining a first gas stream flow path therewithin, such inlet flow passage member having an upper inlet for introduction of the gas stream to the gas stream flow path and a lower exit end for discharge of the gas stream therefrom subsequent to flow of the gas stream through the gas stream flow path within the inlet flow passage member;

a second flow passage member circumscribing the first flow passage member and in outwardly spaced relationship thereto, to define an annular volume therebetween, such second flow passage member extending downwardly to a lower exit end below the lower exit end of the first flow passage member, such second flow passage member having an upper liquid-permeable portion located above the lower exit end of the first flow passage member, and a lower liquid-impermeable portion defining a gas stream flow path of the second flow passage member;

an outer wall member enclosingly circumscribing the second flow passage member and defining therewith an enclosed interior annular volume; and a liquid flow inlet port in such outer wall member for introducing liquid into the enclosed interior annular volume between the outer wall member and the second flow passage member;

whereby liquid introduced via the liquid flow inlet port in the outer wall member enters the enclosed interior annular volume and weepingly flows through the upper liquid-permeable portion of the second flow passage member, for subsequent flow down interior surfaces of the liquid-impermeable portion of the second flow passage member, to provide a downwardly flowing liquid film on such interior surfaces of the liquid-impermeable portion of the second flow passage member, to resist deposition and accumulation of particulate solids thereon, and with the gas stream flowed through the first flow passage member being discharged at the lower exit end thereof, for flow through the flow path of the second flow passage member, and subsequent discharge from the gas/liquid interface structure.

By such arrangement, the gas stream is prevented from directly contacting the walls in the lower portion of the structure, in which the gas stream flow path is bounded by the interior wall surfaces of the second flow passage member. The falling film of water from the "weeping weir" upper portion of the second flow passage member resists particulate solids accumulating on the interior wall surfaces of the second flow passage member. The motive liquid stream on such wall surfaces carries the particulates in the gas stream contacting the water film, downwardly for discharge from the gas/liquid interface structure. Additionally, corrosive species in the gas stream are prevented from contacting the wall, which is protected by the falling water film in the lower portion of the interface structure.

The upper liquid permeable portion of the second flow passage member may be of suitable porous construction, and may comprise a porous sintered metal wall or a porous ceramic wall, with pore sizes which may for example be in the range of from about 0.5 micron to about 30 microns, or even larger pore diameters.

Still another aspect of the present invention relates to a system for the treatment of effluent gas streams, in which the system comprises a pre-scrubber unit, an oxidizer/quench unit, and a scrubber unit, in which the pre-scrubber unit utilizes a counter-current gas/liquid contact tower, wherein water flows downwardly from an upper portion of the tower and contacts gas introduced at a lower portion of the tower, and in which the effluent gas stream is introduced via an inlet structure comprising a first tubular passage which is generally horizontally aligned and is concentrically arranged in relation to an outer circumscribing tubular member having a shield gas port for introduction of shield gas thereinto. The inner tubular member receiving the effluent gas terminates within the outer tubular member. The outer tubular member extends generally horizontally into the lower portion of the pre-scrub tower, with the outer tubular member having a diagonally cut open end disposed in the lower portion of the pre-scrub tower. The diagonally cut end of the outer tubular member is arranged so that the maximum length circumferential portion thereof is arranged to diametrically overlie the shortest length circumferential portion of the outer tubular member, so that the gas stream is discharged from the inner tubular member into the interior volume of the outer tubular member and is discharged from the diagonally cut open end of the outer tubular member into the lower portion of the pre-scrub tower. By positioning the maximum length circumferential portion of the outer tubular member above the minimum length circumferential portion of the outer tubular member, the outer tubular member is arranged to prevent down-falling liquid in the pre-scrub tower from entering such tubular member. Further, such arrangement of the diagonally cut end permits the gas flow stream being introduced to the pre-scrub tower to become developed at the point of its entry into the tower for contacting with the down-falling liquid therein.

Additional aspects of the present invention may variously include the following features:

1. The provision of a totally integrated gas effluent stream treatment system in a unitary cabinet configuration including a non-clogging inlet, pre-scrubber, oxidizer, wet/dry interface, quench, post-scrubber and motive means.

2. The use of a pre-treatment subsystem for hydrogen fluoride absorption. Such pre-treatment subsystem is in essence utilized as a particulate pre-removal system by removing particulate precursors rather than trying to remove fine particulates formed during the oxidation process.
3. The provision of a wet/dry interface of a slit/hole injection type or of a porous type interface, which can substantially reduce water usage and render system leveling unnecessary.
4. The provision of a shell and tube heat exchanger type oxidizer using radiative flux as a working "fluid" on the shell side.
5. The provision of sub-cooling in the water scrubber (together with other features hereinafter more fully described) yielding a condensationless or minimum-condensation design and enhanced thermophoretic acid gas and particulate scrubbing; additionally, an ejector for fluid discharge may be employed to render the effluent gas treatment system "invisible" to the exhaust line of the processing system, or such discharge means may be employed to increase the draw on the upstream process unit (e.g., semiconductor manufacturing tool) if necessary.
6. The use of a demister mesh as a packing element in the scrubber column. Such demister mesh can substantially reduce wall effects in scrubber columns of small diameter. Mass transfer and heat transfer in the scrubber column as a result are comparable to or better than scrubber column performance with standard commercially available random packings, and demister mesh-containing scrubber columns achieve relatively low pressure drop. The void fraction at the top of the scrubber column can also be flexibly designed to constitute the scrubber column as a good particle collector; random packings are not as flexible and do not readily permit the flexibility achievable with demister mesh-containing scrubber columns.
7. The use of heat transfer enhancement inserts in the oxidizer to tailor the effluent gas stream treatment system to applications requiring varying thermal fluxes in the overall operation of the system.
8. The recycle of a saturated $H_2O$/exhaust stream from the quench of an oxidizer unit in the effluent gas treatment system to the inlet of the oxidizer unit provides a low cost hydrogen source for oxidation of perfluorocarbons (PFCs).
9. The addition of chemicals into the pre-scrubber may be employed to alter the characteristics of the materials to be scrubbed. An illustrative example is the addition of $NH_3$ to tungsten hexafluoride effluent to form ammonium tungstate, thereby yielding a material with elevated solubility for scrubbing removal thereof.
10. The utilization of a transpiration tube reactor design for the oxidizer unit to eliminate wall accumulations of reactant/product solids in the oxidation step.
11. The use of a dual fluid atomizing nozzle in the quench unit receiving the hot effluent stream from the oxidizer unit, in order to minimize quench unit size, or the alternative use of other small droplet atomizing means such as ultrasonic nozzles or piezoelectric nozzles in the quench unit.
12. The integration of the gas effluent treatment system of the present invention with specific semiconductor manufacturing process tools.
13. The utilization of effluent gas introduction (inlet) means to avoid clogging, as for example by deployment of the anti-clogging inlet structure described more fully hereinafter.
14. The flexibility in the oxidizer unit to utilize electric or flame (methane, propane, hydrogen, butane) based oxidation, and/or the ability to use air or $O_2$.
15. The use of a wet scrubber or a dry scrubber as pre-scrubbing and post-scrubbing means.
16. The use of a fluidized bed thermal oxidizer unit.
17. The use of a non-PFC-destructive PFC-recycle/recovery unit in the effluent gas stream treatment system.
18. The provision of a clog-free oxidizer unit employing inserts for disruption of the gas flow stream laminar boundary layer.

Other aspects, features and embodiments will be fully apparent from the ensuing disclosure.

DETAILED DESCRIPTION OF THE INVENTION, AND PREFERRED EMBODIMENTS THEREOF

Figure 1:
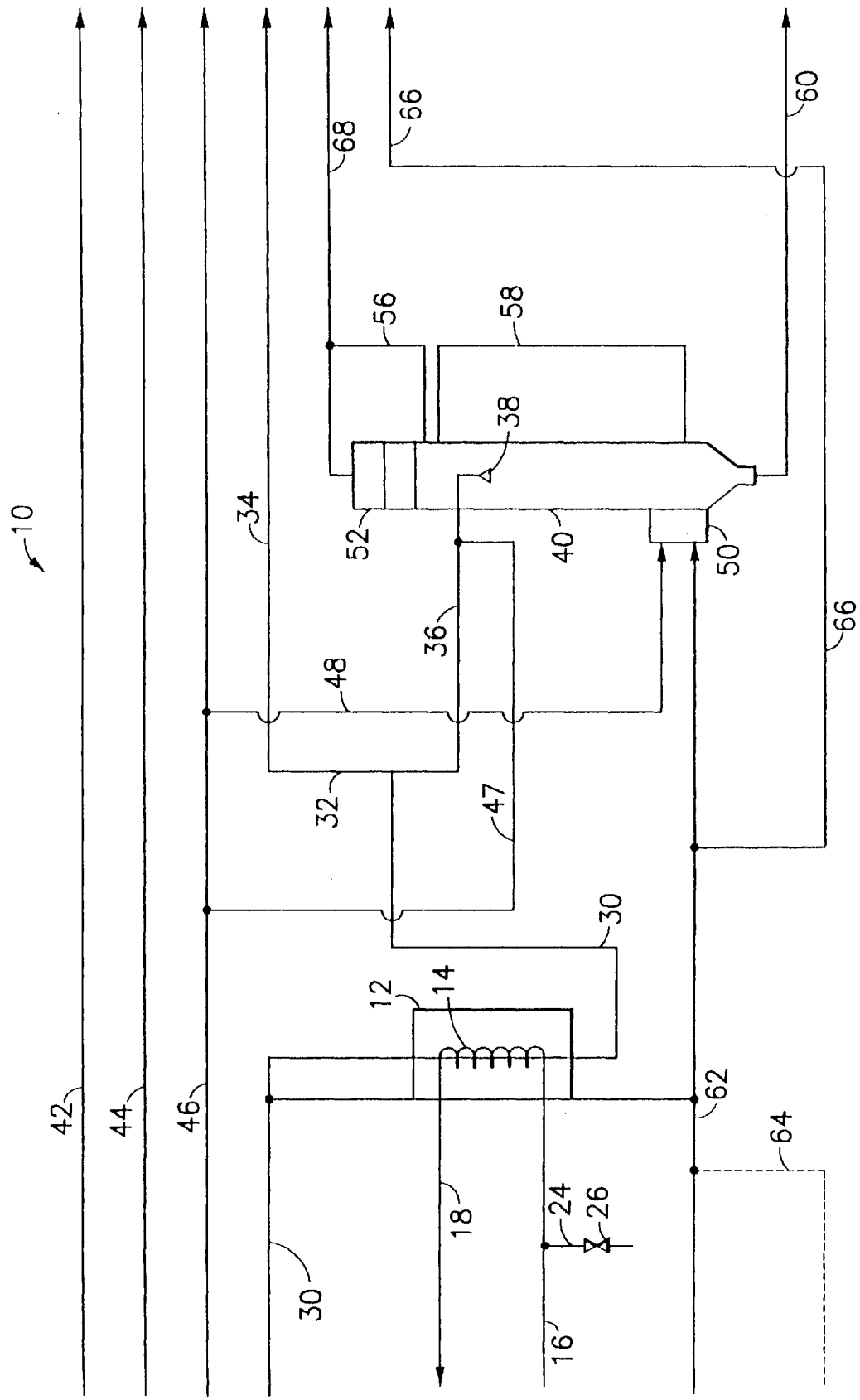
FIGS. 1–3 are consecutive sections of a schematic flowsheet for a gas effluent treatment system according to one embodiment of the invention, showing in dashed line representation in FIG. 3 a variation of the flowsheet for a gas effluent treatment system according to another embodiment of the invention.

The objective of the present invention is to provide an improved gas effluent treatment system, which may be utilized to treat a wide variety of effluent gas streams, deriving from correspondingly diverse industrial processes.

In one aspect, the present invention contemplates a system for oxidation treatment of an effluent gas stream deriving from an upstream process unit generating such effluent, in which oxidization and scrubbing processes are carried out, to abate hazardous or otherwise undesired species in the effluent gas stream.

In a particular aspect, such effluent gas stream treatment system may comprise oxidation and scrubbing unit operations, in which the system is constructed and arranged to minimize the adverse effect of solid particulates in the gas stream, such as may derive in the first instance from the upstream process, or which may be generated in-situ in the effluent treatment system, e.g., as a result of the oxidation treatment of the effluent gas stream, resulting in particulate reaction products.

The invention additionally relates to effluent gas treatment systems, in which gas/liquid interface structures are employed, to minimize adverse effects of fluid hydrodynamic behavior, and to minimize particulate solids accumulation and suppress clogging incident to the accumulation of solids in the system.

In another aspect, the present invention contemplates an integrated thermal treatment system which is competitive with, and superior to, other integrated thermal treatment systems on the market. Such integrated gas treatment system combines front-end thermal treatment with exhaust gas conditioning, and provides low cost of ownership to the end-user.

The integrated effluent gas stream treatment system of the invention may utilize an electrically based thermal oxidation treatment unit. While the ensuing description of the invention herein is primarily directed to effluent gas stream treatment systems employing an electrical thermal treatment unit, it will be recognized that the treatment system of the invention could alternatively be configured to include other thermal treatment components, e.g., flame-based treatment, fluidized bed treatment, plasma treatment, etc.

By providing a flexible unit-operations based modular platform, the effluent gas treatment system of the invention can be readily tailored to a wide variety of effluent gas streams, e.g., semiconductor fabrication tool emissions, and may be readily modified to incorporate other unit operations treatment without undue effort.

The effluent gas stream treatment system of the present invention in various embodiments thereof provides significant advantages over prior art treatment systems, including resistance to clogging within the constituent effluent gas treatment units and associated flow piping and channels, enhanced resistance to corrosion as a result of efficient gas/liquid interface structures, extended on-stream operating time before maintenance is required, low water usage rates when scrubbing treatment is employed, superior scrubbing efficiency, with removal levels greater than 99.99% by weight of effluent scrubbable species, and reduction below Threshold Limit Value (TLV) levels for halogen species such as HCl, $Cl_2$ and HF, oxidative destruction of hazardous species below TLV levels, elimination of corrosive condensation of acids in process lines downstream of the oxidizer unit, flexible arrangement of constituent treatment units in the effluent gas treatment system, and the capability for accommodating multiple sources of effluent gas from upstream process facilities.

Considering the oxidizer unit in the effluent gas treatment system of the invention, the oxidizer may utilize an electrical power source for electrothermal oxidation of effluent gas species, or the oxidizer may utilize fuel such as hydrogen and methane. If the system is arranged to carry out destruction of perfluorocarbons in the oxidation treatment, the system may be arranged to utilize water vapor as an $H^+$ radical source for effecting destruction of the perfluorocarbons. The oxidizer medium for such oxidation treatment may comprise air, oxygen, or other oxygen-containing gas. In the quenching of the hot effluent gas stream from the oxidizer, and for scrubbing purposes, water may be employed for gas contacting, being dispersed for such contact by atomizer spray nozzles, or other suitable dispersers, which minimize droplet size and water consumption in the operation of the effluent gas treatment system. In the treatment of streams from the oxidizer which contain significant quantities of silica particles, it may be desirable to utilize a caustic solution as a quench medium, to effect removal of the silica particles.

Relative to effluent gas treatment systems of the prior art, the system of the present invention achieves various advantages in terms of clogging resistance and corrosion resistance, minimization of water use, and flexibility in arrangement of effluent gas process units of the treatment system in a compact, efficient conformation.

A pre-treatment unit may be employed in the effluent gas treatment system of the invention to remove particulate and acid gases from the process stream before they get to the heated oxidation chamber and while they are at low temperature, thereby simplifying the duty requirements of the downstream equipment.

While prior art systems may clog and require the introduction of special unplugging mechanisms, the system of the present invention relies substantially on inherent fluid dynamics to prevent the system from plugging in the first instance.

The effluent gas stream treatment system of the present invention may be arranged in a compact unitary cabinet having a suitable small footprint, so that the floor space area required by the cabinet in a process facility is minimized.

When the effluent gas treatment system of the invention utilizes an oxidation unit for oxidizing species in the effluent gas stream, the oxidizer medium is preferably clean, dry air, although oxygen or oxygen-enriched air may be employed for such purpose, as well as any other oxygen-containing gas of suitable character. The effluent gas treatment system of the present invention may be utilized for treatment of a single upstream process unit generating effluent gas, or alternatively a plurality of effluent gas sources may be present, from which the constituent effluent gas streams are consolidated into an overall stream which is transported to the effluent gas treatment system of the invention, for abatement of hazardous or otherwise undesirable components of such gas stream, to yield a final effluent depleted in such components.

In some instances, it may be desirable to operate in a time-varying mode, if the composition of the effluent gas stream varies with time due to differing effluent gas generating processes being carried out. For example, in semiconductor manufacturing, in the case of tungsten chemical vapor deposition (CVD), silane emissions may be generated in the deposition step, and subsequent to such CVD operation, the CVD reactor may be cleaned, resulting in the production of $NF_3$ gaseous components. Since silane derived from the CVD step would react violently with $NF_3$ from the CVD reactor cleaning step, such gaseous components cannot be mixed for unitary treatment, and therefore require separate processing in the effluent gas treatment system.

In the general practice of the present invention, the effluent gas treatment system may utilize a pre-treatment unit, in which the effluent gas is contacted with water to carry out a preliminary scrubbing step, upstream of oxidation treatment of the effluent stream. Such pre-treatment therefore may involve scrubbing with water, or alternatively, such pre-treatment unit could employ a chemical neutralization mixture for contacting with the effluent gas stream, and likewise the effluent from the oxidation unit could be scrubbed using water or a chemical neutralization mixture. Accordingly, the scrubbing unit operations contemplated in the broad practice of the effluent gas treatment system of the present invention may utilize any suitable scrubbing medium, as appropriate to the specific gas stream being processed. Alternatively, the scrubbing may be carried out as a dry scrubbing operation, rather than wet scrubbing. For such purpose, a wide variety of gas dry scrubber materials are readily commercially available, and may be employed for such purpose within the broad practice of the present invention and the skill of the art. The scrubber units employed in the practice of the present invention may be of any suitable type, and may be constructed to minimize solids clogging problems in their operation.

The effluent gas treatment system of the present invention thus may be widely varied in conformation and constituent treatment units. Such constituent treatment units may include an oxidizer which can be of varying type, such as a thermal oxidizer, catalytic oxidizer, flame oxidizer, transpirative oxidizer, or other process unit for effecting oxidation of oxidizable components within the effluent gas stream composition.

The effluent gas treatment system may also comprise a pre-treatment unit, as mentioned, in which the effluent gas stream from the upstream facility is contacted with an aqueous medium or chemical neutralization composition, or alternatively with a dry scrubber composition, to effect initial abatement of some of the components in the effluent gas stream prior to subsequent oxidation and scrubbing treatment. The oxidation unit may be constructed and arranged to discharge hot effluent gas to a quench zone which may be integrated with a main scrubbing unit, as hereinafter more fully described, whereby the temperature of the effluent gas from the oxidizer unit is markedly reduced for efficient subsequent treatment. The unit may use a motive fluid means, either an active means such as a pump, fan, compressor, turbine, etc., or a passive motive fluid driver such as an eductor, aspirator, or the like.

The effluent gas treatment system of the present invention may further employ, in connection with use of aqueous media for scrubbing, various neutralization processes, for removal of acidic components therefrom, or otherwise for achieving a desired pH level, for purposes of discharge of water from the effluent gas stream treatment system.

As a further variant, the effuent gas treatment system of the invention may further comprise a wet electrostatic precipitator for flume/plume control, in the treatment of the effluent gas stream.

Various aspects of the design and construction of the effluent gas treatment system of the present invention are described below.

The oxidizer unit may be provided with suitable temperature controls and heat tracing, for temperature controlled operation of the oxidation unit.

The effluent gas pre-treatment unit may be arranged to remove as much acid gas and particulates from the gas stream as possible before the gas stream enters the oxidation unit, thereby decreasing the duty requirement on downstream equipment. As mentioned, such pre-treatment unit may comprise a wet scrubbing unit or alternatively a dry scrubbing unit, or a combination wet and dry scrubbing assembly comprising constituent wet and dry scrubbing units. Potentially useful wet scrubbing systems include wet cyclones, wet packed towers, and wet spray towers. Such wet towers may operate in either co-current flow or counter-current flow regimes.

The pre-treatment unit of the effluent gas treatment system may, for example, comprise a wet spray tower which utilizes a nitrogen-assisted atomizing nozzle to introduce atomized scrubbing water at an upper portion of the tower. If chemical addition is desired, chemical mixing may be carried out by use of such means as an in-line liquid-based static mixer with appropriate chemical storage and metering. Nitrogen-assisted water atomization is advantageously employed to minimize water consumption of the effluent gas treatment system, and to prevent the effluent gas constituents from reacting with air upstream of the oxidation unit. The liquid from such wet processing unit operations may be drained to a common holding reservoir, which may be designed as an integral part of the scrubber/quench tower, as hereinafter more fully described. As a further variation, the wet spray pre-treatment step may be replaced by operation with a spray-fed venturi nozzle, to effect acid gas absorption and particulate removal.

Thus, the present invention in the provision of a wet scrubbing unit upstream of the oxidation unit provides the capability of controlling particulate formation in the oxidation unit by scrubbing effluent gas stream components which are particle-forming agents under the conditions existing in the oxidation unit.

The oxidation unit as indicated hereinabove may be constructed with any suitable configuration. For example, the oxidation unit may be constituted by an electrothermal oxidizer utilizing a wrap-around clam-shell electric radiant heater having a large gap between the heater surface and the heated tubes.

In a specific embodiment, the oxidation unit may comprise a single vertical heated tube, with effluent gas being introduced through a sparger, and with the effluent gas being blanketed in a nitrogen sheath to suppress reaction until the effluent gas is actually within the oxidation chamber. Once within the oxidation chamber, air or other oxidizer medium may be injected to flow co-axially with the blanketed effluent gas stream. The effluent gas introduction means are desirably constructed to closely simulate iso-kinetic laminar flow, to prevent recirculation zones, eddies, stagnation zones, and other anomalous flow behavior, which could cause particle accumulation in operation of the oxidation unit.

The heated tube in such oxidation unit may be selectively controlled by suitable thermal control means, to achieve desired operating temperature regime. While minimum temperature conditions may be required to achieve ignition and destruction of oxidizable components in the oxidation unit, excessively high temperatures may also promote particle agglomeration and accumulation on tube wall surfaces. Accordingly, the heated tube oxidation unit may utilize heat transfer-enhancing tube inserts to prevent particle agglomeration on tube side walls, by promoting fluid flow transition to turbulence in the effluent gas stream being flowed through the oxidation unit.

Alternatively, the oxidation unit may comprise a bundle of heat exchanger tubes to accommodate higher gas stream flow velocities, and thereby suppress particle agglomeration on the wall surfaces of the tubes. In such heat exchange tube bundles, heat transfer enhancement inserts may be employed, as described above in connection with the single vertical heated tube configuration of the oxidation unit.

As a still further alternative, the oxidation unit may comprise a multiple bank of twisted tubes, which accommodate high gas stream velocities and long residence times, while maximizing turbulent agglomeration of particles in the gas stream, via the provision of a continuously spiraling gas flow path. Such arrangement may afford an increase in particle size to a point where subsequent removal of solids from the gas flow stream is readily carried out.

Materials of construction for the oxidation unit include any suitable materials of construction, having due regard for the specific chemical composition of the effluent gas stream being processed. Suitable materials may include high temperature oxidation-resistant alloys, with good resistance characteristics relative to HF and HCl. The oxidation unit may be operated in a reducing environment, to avoid destruction of perfluorocarbon components, and suitable alloys may be employed as materials of construction to withstand such reducing conditions. In this respect, the effluent gas treatment system of the present invention may utilize a unit for recovering the perfluorocarbon components of the effluent gas stream, for recycling thereof or other disposition.

As a further variation, the oxidation unit may be constructed with an electrically fired heater for heating of air or other oxidizer medium to high temperature for mixing with the effluent gas stream. Such arrangement may in some instances provide self-ignition of oxidizable components in the effluent gas stream, upon contact and mixing with the oxidizer medium, and this may increase the overall oxidation efficiency of the oxidation unit.

As yet another variation, the oxidation unit may be constructed as a transpirative oxidation unit. The oxidation unit produces an oxidized effluent gas stream which is at elevated temperature. Such hot stream is therefore subjected to quench or cooling, to reduce the temperature for subsequent processing and final discharge from the effluent gas treatment system.

The effluent gas treatment system may therefore comprise a quench unit downstream of the oxidation unit. The quench unit may for example comprise a single vertical tube with an air-assisted water atomizing nozzle, for contacting water or other quench medium with the hot effluent gas from the oxidation unit. An overflow weir interface structure may be provided in the quench section, to provide a well-defined hot/cold interface. The quench unit may be constructed from a suitable alloy such as a dewpoint corrosion-resistant alloy. Examples include Al6XN, Carpenter 20, HaC-22 and HaB alloys. The quench unit is desirably constructed to minimize adverse thermal effects on other process units of the effluent gas treatment system.

The quench unit alternatively may comprise a multi-tube co-flow falling film acid absorption column with a shell-side chilled water supply to effect heat transfer.

The oxidation unit and quench unit may be aligned in a single vertical orientation to provide a unitary linear gas flow path which minimizes anomalous flow behavior and particle accumulation.

As a still further alternative, the quench unit may be constituted by a spray-fed venturi quench apparatus for quenching and particle removal purposes.

The effluent gas treatment system of the present invention may utilize a scrubber downstream of the oxidation unit. Such scrubber may comprise a single vertical packed tower, with a liquid injection manifold on top of the column of packing, and a demister pad or other demisting means thereover. The scrubber may be fed with liquid feed water, which may be chilled or at appropriate temperature, in relation to the effluent gas discharged from the oxidation unit and optionally subjected to quenching or preliminary cooling upstream of the scrubber. The scrubber may therefore incorporate a chiller which can stand next to the scrubber tower and pre-chill the scrubbing water or other aqueous scrubbing medium. In lieu of the use of demister pads or similar mechanical means for minimizing or eliminating residual mist (small size water droplets), scrubber units in the practice of the invention may be constructed to hydrodynamically minimize or substantially eliminate such mist component by subjecting the gas stream to contact with larger droplet water "knock-down" sprays to remove the mist component from the gas stream.

The use of chilled water in scrubbing is desirable, to chill the effluent gas stream to below ambient temperature, to thereby reduce the quantity of water vapor below prevailing ambient relative humidity conditions, e.g., in the environment of the semiconductor manufacturing operation, when the effluent gas stream derives from a semiconductor manufacturing tool. The use of chilled water is also desirable to introduce a thermophoretic effect to enhance acid gas absorption and particulate absorption in the packed column.

An alternative scrubber unit comprises a falling film acid absorption column with chilled water feeding a shell-side of the absorption column. With such scrubber unit, liquid from the pre-treatment unit, the quencher, and the scrubber unit may be channeled to drain into a common reservoir on the bottom of the scrubber column. In such manner, the used liquid streams from the effluent gas treatment system are consolidated, and such reservoir may be arranged for gravity feed operation thereof.

Alternatively, the scrubbing liquid and other liquid streams from the constituent process units in the effluent gas treatment system may be pressurized or discharged from the system by suitable pumping means, such as a centrifugal pump, peristaltic pump, air-driven pump, water-fed eductor, or other suitable liquid motive driver means.

In a packed column scrubber, a demister may be employed. The scrubber column, as with other components of the effluent gas treatment system, may be formed of any suitable materials, such as metal alloys, or coated structural steel or other metals, having coatings of appropriate resistant character relative to corrosive species in the fluid streams being processed therein.

The effluent gas treatment system of the present invention may be constructed either with or without provision for recirculation of used liquid streams. As mentioned, the scrubber unit may comprise a dry scrubber, and it may be feasible in some instances to replace the scrubber unit and quencher unit with a dry scrubber cartridge unit. The scrubber may also be provided with an optional chemical pre-treatment unit, to allow the use of wet or dry chemical injection to the scrubber unit.

An eductor may be employed to provide motive force to draw the effluent gas stream through the effluent gas treatment system. Such eductor preferably is of a corrosion-resistant and plug-resistant design, utilizing clean, dry air or other eduction fluid, with a modulating valve and control to provide appropriate inlet pressure to the effluent gas treatment system at a desired pressure level. The eductor may also be employed to supply a stream of heated dry air to the water vapor-saturated exhaust stream from the water scrubber when employed in the treatment system. Such provision of heated dry air thus serves to lower the relative humidity of the effluent gas stream below ambient saturated conditions. The eductor may utilize air, nitrogen or other suitable educting medium.

The eductor may also be coupled with a suitable filtration module, to permit filtration of the eductor discharge, for capture of fine particulates in such discharged gas.

The effluent gas treatment system of the present invention may be utilized for processing of effluent gas streams from a wide variety of upstream process facilities. For example, the effluent gas processed in the effluent gas treatment system may comprise effluent from a tungsten CVD tool of a semiconductor manufacturing plant in which wafers are processed to deposit tungsten thereon, with subsequent cleaning of the tool to remove excess tungsten deposits from chamber walls, pedestal elements, and electrodes of the tool assembly.

It will be appreciated that a wide variety of chemistries and effluents may be generated in the operation of a semiconductor manufacturing facility, and that the construction, arrangement and operation of the effluent gas treatment system of the invention may be widely varied to effect treatment of the gas discharged from the tools and manufacturing operations of the upstream process facility.

Figure 2:
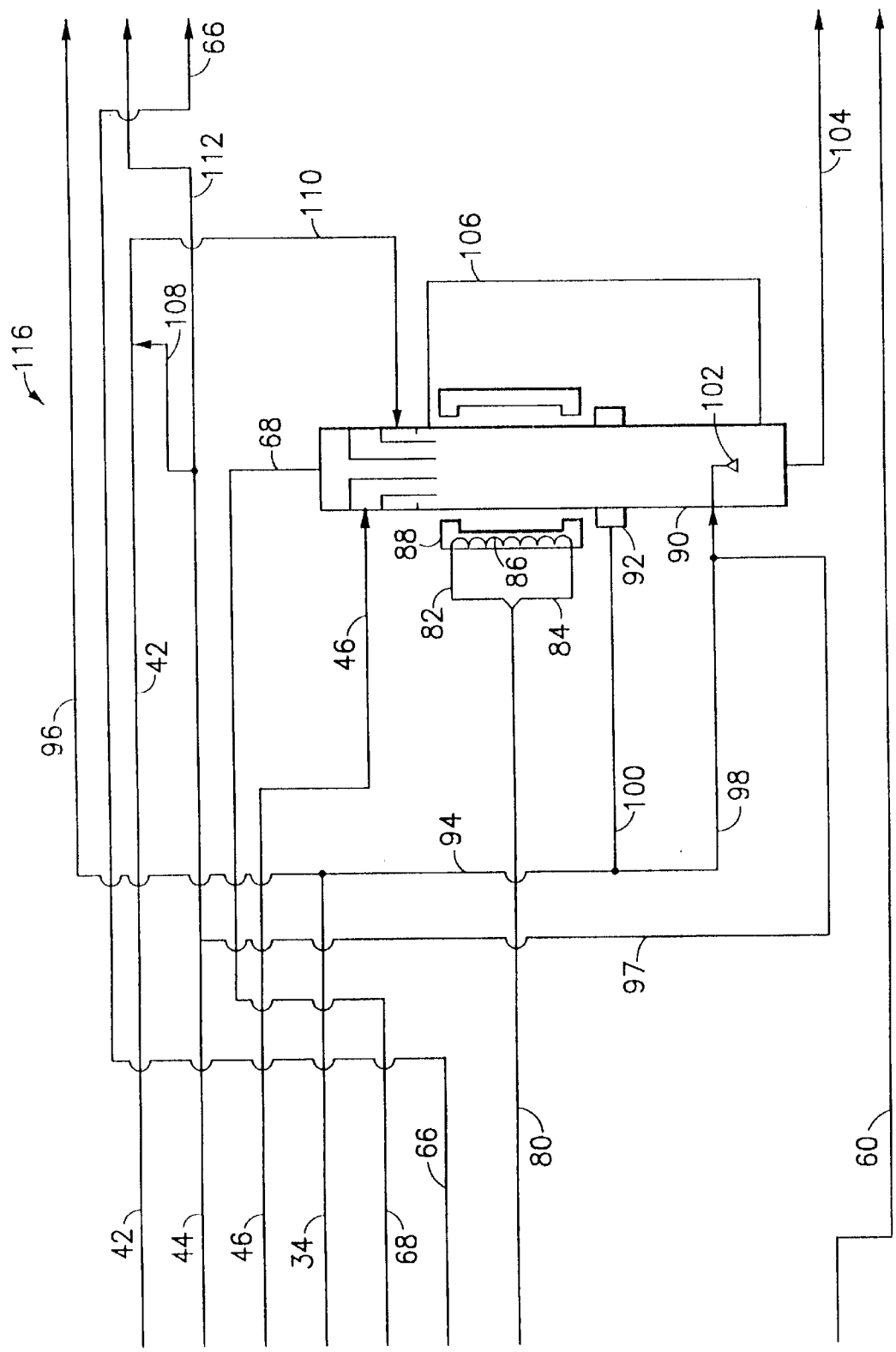
Figure 3:
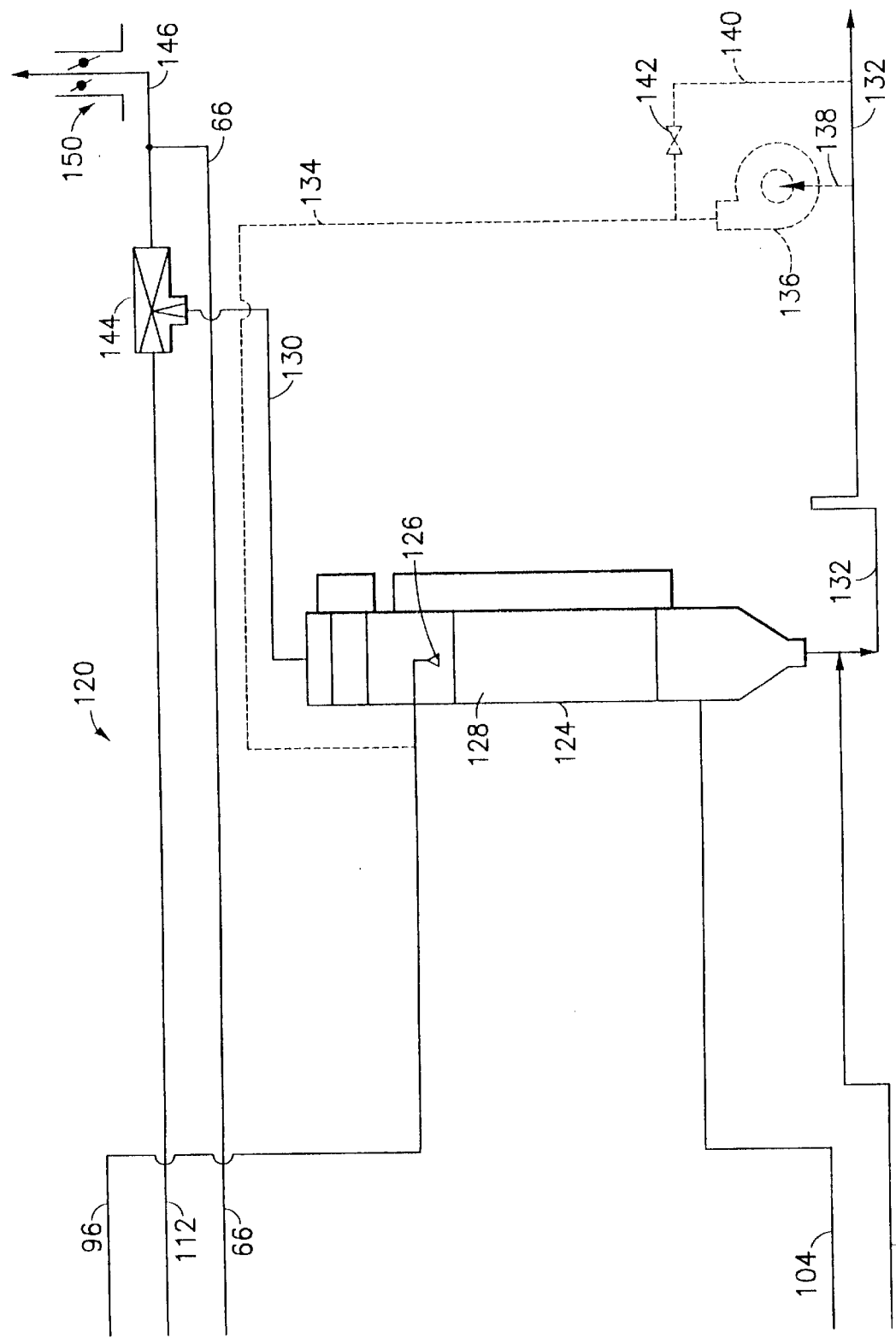

Referring now to the drawings, FIGS. 1–3 are consecutive sections of a schematic flowsheet for a gas effluent treatment system 10 according to one embodiment of the invention, showing in dashed line representation in FIG. 3 a variation of the flowsheet for a gas effluent treatment system according to another embodiment of the invention.

In the ensuing disclosure, valves, instrumentation and ancillary control means have been variously omitted for clarity, to facilitate the discussion of the salient features of the invention, which has been rendered in schematically illustrated form in the drawings for such purpose. It will be recognized that the valving, piping, instrumentation, and control means may be variously configured and implemented in the broad practice of the present invention, within the skill of the art.

The FIG. 1 section of the flowsheet features a chilled water heat exchanger 12 containing a heat exchange passage 14 therein through which chilled water is flowed from line 16 and is discharged in line 18.

Line 16 is joined to drain line 24 containing valve 26 therein. Lines 16 and 18 may be suitably insulated to maximize the effectiveness of the chiller. Water in line 30 is flowed through the chiller 12, and passed to manifold line 32, from which the water is divided into two parts, with one part in line 34 being flowed through the system as shown, and the other part being passed in line 36 to the spray head 38 for introduction to the effluent gas stream pre-treatment column 40.

Effluent gas is introduced in line 62 and passed to the pre-treatment column 40. Line 62 may be insulated with heat tracing 64 along its length, and the branch line 66, of insulated heat traced character, may pass to the next section of the flowsheet shown in FIG. 2.

Line 42 is an oxygen line for the process system, line 44 is a clean dry air line, and line 46 is a nitrogen supply line, which may as shown branch to nitrogen feed line 47 for introducing nitrogen to the water in line 36 being flowed to the pre-treatment column 40.

The effluent gas stream is introduced in line 62 to the column inlet section 50, and may be augmented by addition of nitrogen from branch line 48 if and to the extent desired. The effluent gas stream is pre-treated in the column 40 to produce a bottoms in line 60 which is passed to the portion of the flowsheet in FIG. 3. The column at its upper end 52 produces an overhead in line 68 which is passed to the reactor 90 in FIG. 2. A portion of the overhead may be recycled in line 56 to the column, and further reflux may be accommodated by the line 58 as shown.

In FIG. 2, the system 116 comprises the oxidation reactor 90 receiving nitrogen at its upper end from line 46, with oxygen in line 42 and optionally clean dry air from line 44 from branch conduit 108 being combined to provide the oxygen-containing gas in line 110 which is passed to the upper end of the reactor.

Water in line 34 is divided at the manifold 94 into branch line 96, passed to the section 120 of the system shown in FIG. 3, and into branch line 98, in which the fluid stream may be augmented by clean dry air from branch line 97 of line 44 and passed to nozzle 102 in oxidation reactor 90. The remainder of the clean dry air is flowed in line 112 to the FIG. 3 portion of the process system.

The oxidation reactor is also arranged to receive water from line 100 via inlet 92 at an intermediate portion of the reactor vessel. The reactor features a reactor heater 88, comprising a heat exchange passage 86 therein coupled with branch lines 82 and 84 of power line 80, by which the heater 88 is actuated to provide electrical resistance heating of the reactor for thermal oxidation of the effluent gas stream introduced in line 68 to the oxidation reactor. The oxidation reactor may be provided with recirculation line 106 interconnecting the upper and lower ends thereof as shown. Effluent from the reactor is flowed in line 104 to the FIG. 3 portion of the process system.

FIG. 3 comprises portion 120 of the process system and includes scrubber 124 defining an interior volume 128 for scrubbing with water which is introduced in line 96 to the nozzle 126. The effluent gas stream is introduced to the scrubber in line 104. The scrubber bottoms in line 132 is joined with liquid from the effluent gas stream pre-treatment in line 60, is discharged from the system, and is passed to waste water treatment or other end use disposition of such liquid.

The scrubbed overhead is passed in line 130 to the eductor 144, which is supplied with clean dry air from line 112 to produce the treatment system effluent, which is flowed in line 146 to the exhaust 150 as schematically shown. The effluent may be augmented by the addition thereto of bypass fume from line 66, and such line 66 may as mentioned be heat-traced and insulated.

FIG. 3 shows a modification in dashed line representation, wherein pump 136 is deployed to recycle the liquid bottoms in line 132 through inlet pump line 138 to discharge liquid line 134, from which the recycle liquid is joined with the scrubbing water in line 96, to enhance the scrubbing operation by treatment of the recycle liquid therein. Treated liquid then is discharged from the system in line 140 containing valve 142 therein.

Figure 4:
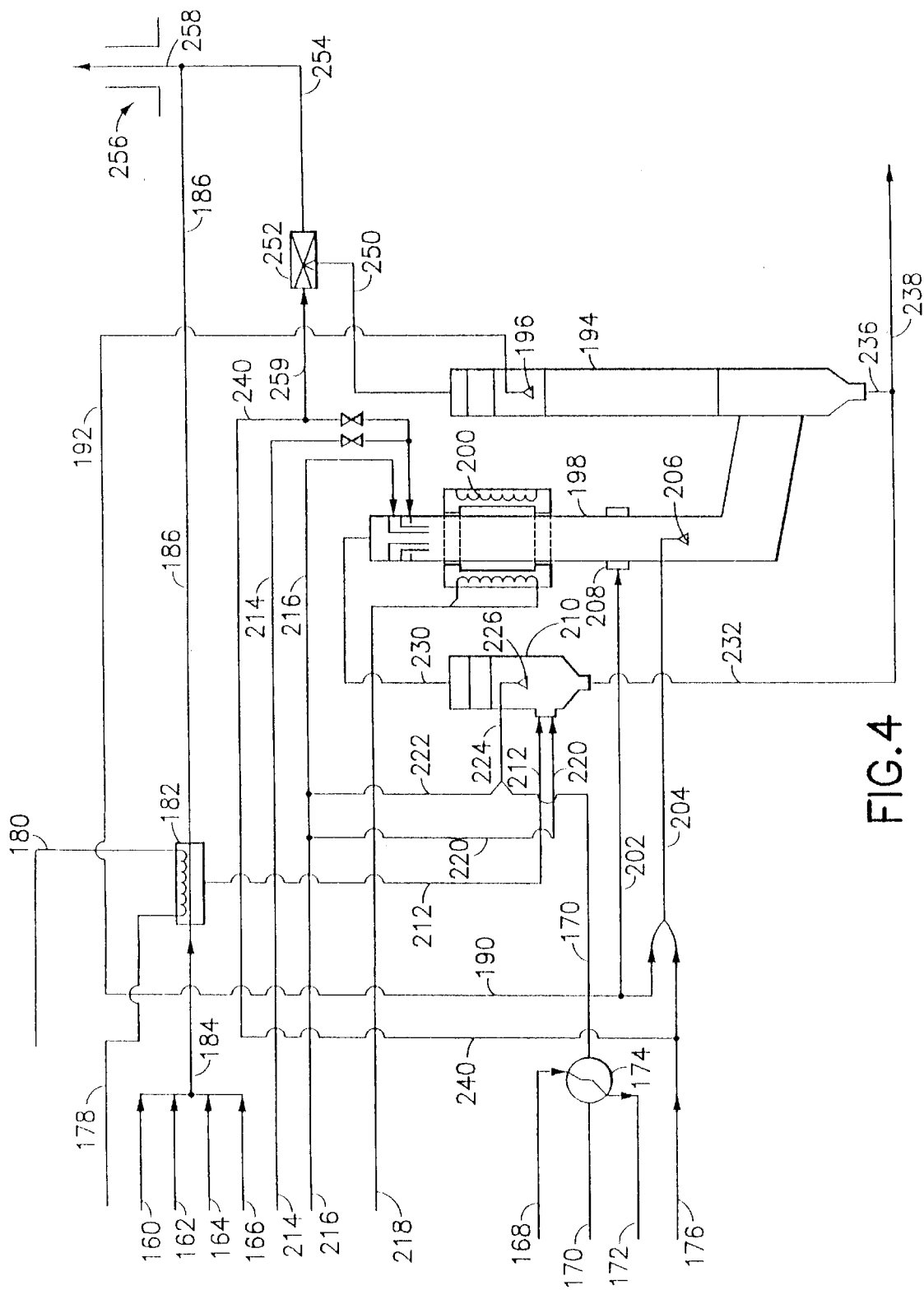
FIG. 4 is a schematic flowsheet of a gas effluent treatment system according to another embodiment of the invention.

FIG. 4 is a schematic flowsheet of a gas effluent treatment system according to another embodiment of the invention. In this system, the gas effluent stream is introduced in lines 160, 162, 164, and 166 and joined to form the combined effluent gas stream in line 184, which then is passed to heat exchanger 182 comprising heat exchange passage 180, in which flows an appropriate heat transfer fluid originating from line 178, to effect heat exchange of the consolidated stream. The heat-exchanged effluent gas stream then may be passed in line 212 to the effluent gas stream pre-treatment column 210. Alternatively, a part or all of the effluent gas stream may be bypassed from the treatment system and flowed in line 186 to the exhaust 256, if desired.

The chilled water heat exchanger or chiller 174 receives chilled water feed in line 168, and discharges the return chilling water in return line 172. Water in line 170 passes through the chiller and is joined to chilled water supply line 190. Line 170 continues and is joined in line 224 with nitrogen in branch line 222 from main nitrogen feed line 216, and is discharged in the pre-treatment column 210 via nozzle 226. Additional nitrogen may be introduced to the pre-treatment column 210 in line 220 from the main nitrogen feed line 216.

Clean dry air is introduced to the system in line 176, and a portion thereof may be passed in line 240 to the reactor 198 at an upper end thereof, together with nitrogen in line 216. Oxygen is introduced to the reactor in line 214. The reactor receives the overhead from pre-treatment column 210 in line 230. Power line 218 provides energy to the electrical resistance heater 200 of the reactor 198 as shown.

The quench portion of the vessel containing oxidation reactor 198 at its upper end, receives water from line 202 at inlet 208, and a mixture of water and clean dry air is introduced in line 204 to the nozzle 206 in the quench portion of the vessel. The quench portion of the vessel communicates with the scrubber 194. The scrubber at its upper end receives water from line 192 at nozzle 196.

Overhead gas from the scrubber is passed in line 250 to the eductor 252 in line 250. The eductor receives clean dry air in line 259 from line 240. The educted stream in line 254 then is joined with any bypassed effluent gas from line 186 and is flowed in line 258 to the exhaust 256 of the treatment system.

The bottoms from the effluent gas stream pre-treatment column 210 in line 232 and the bottoms from scrubber 194 in line 236, are joined in line 238 and may be passed to waste liquid discharge or other treatment.

Figure 5:
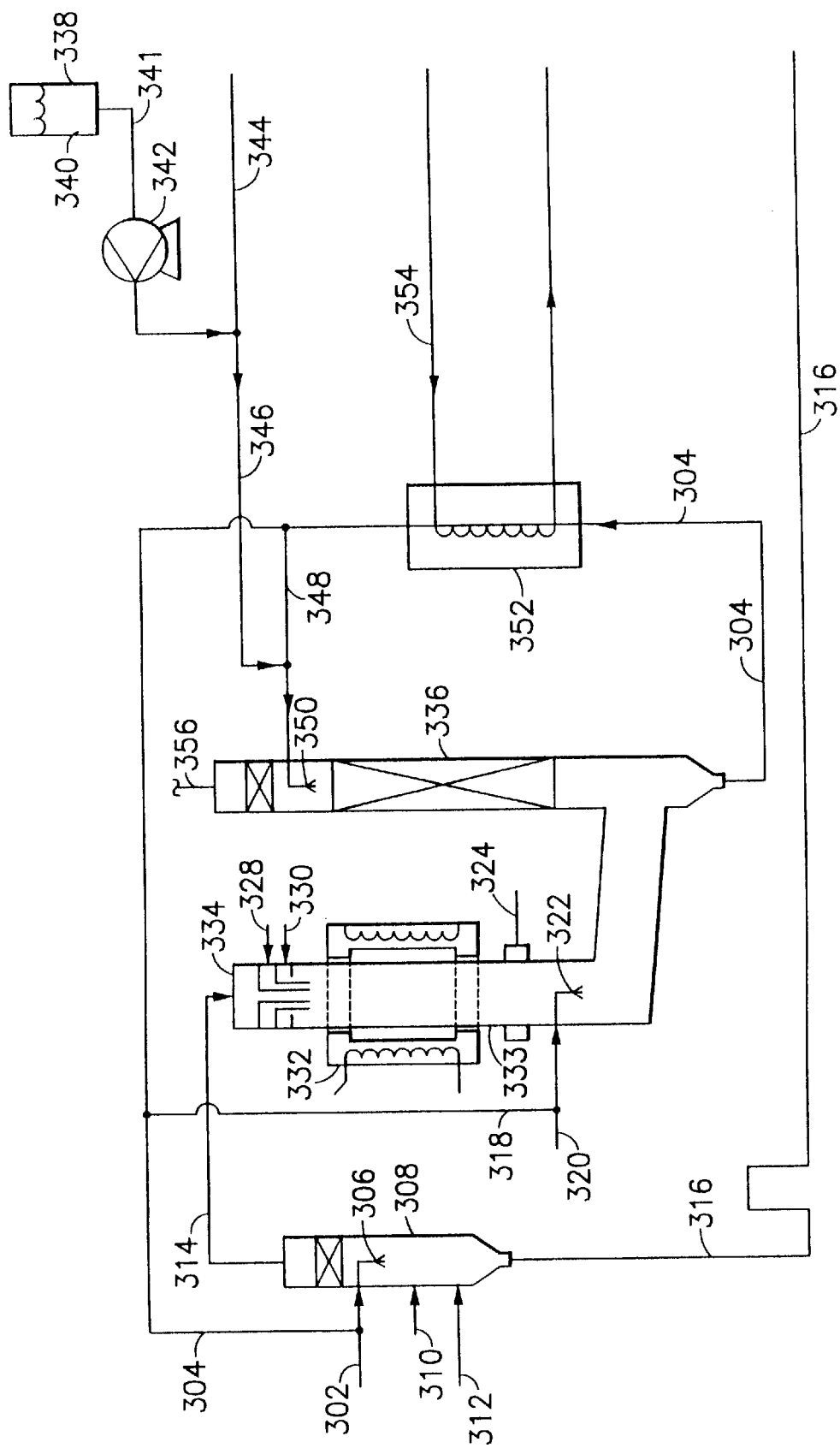
FIG. 5 is a schematic flowsheet of a further effluent gas treatment system embodiment of the invention.

FIG. 5 is a schematic flowsheet of a further effluent gas treatment system embodiment of the invention. The effluent gas stream is introduced in line 312 to the pre-treatment column 308, together with nitrogen in line 310 and water in line 302 introduced via nozzle 306. The water stream to nozzle 306 may be augmented with recycled liquid from line 304. The bottoms from the effluent gas stream pre-treatment column 308 is discharged through line 316 to waste liquid discharge or other treatment.

The pre-treatment column overhead in line 314 is passed to the oxidation reactor 334, which also receives oxygen in line 330 and nitrogen in line 328. The oxidation reactor 334 is equipped with electrical resistance heater 332, and quench water is introduced to a lower quench portion of the vessel 333 in line 324. Water or air/water mixture is injected in the quench portion of the vessel 333 at nozzle 322 from line 320, augmented if desired by recycle liquid from line 318.

The scrubber 336 discharges scrubbed gas in line 356, with scrubbing water being flowed in line 344 and joined by treating chemical 340 from vessel 338 pumped in line 341 by pump 342, to form the scrubbing liquid flowed in line 346 and joined with recycle liquid in line 348 to provide scrubbing medium introduced to the scrubber 336 in nozzle 350. Bottoms from the scrubber is flowed in line 304 to the waste water heat exchanger 352 and heat exchanged with chilled water in line 354.

Figure 6:
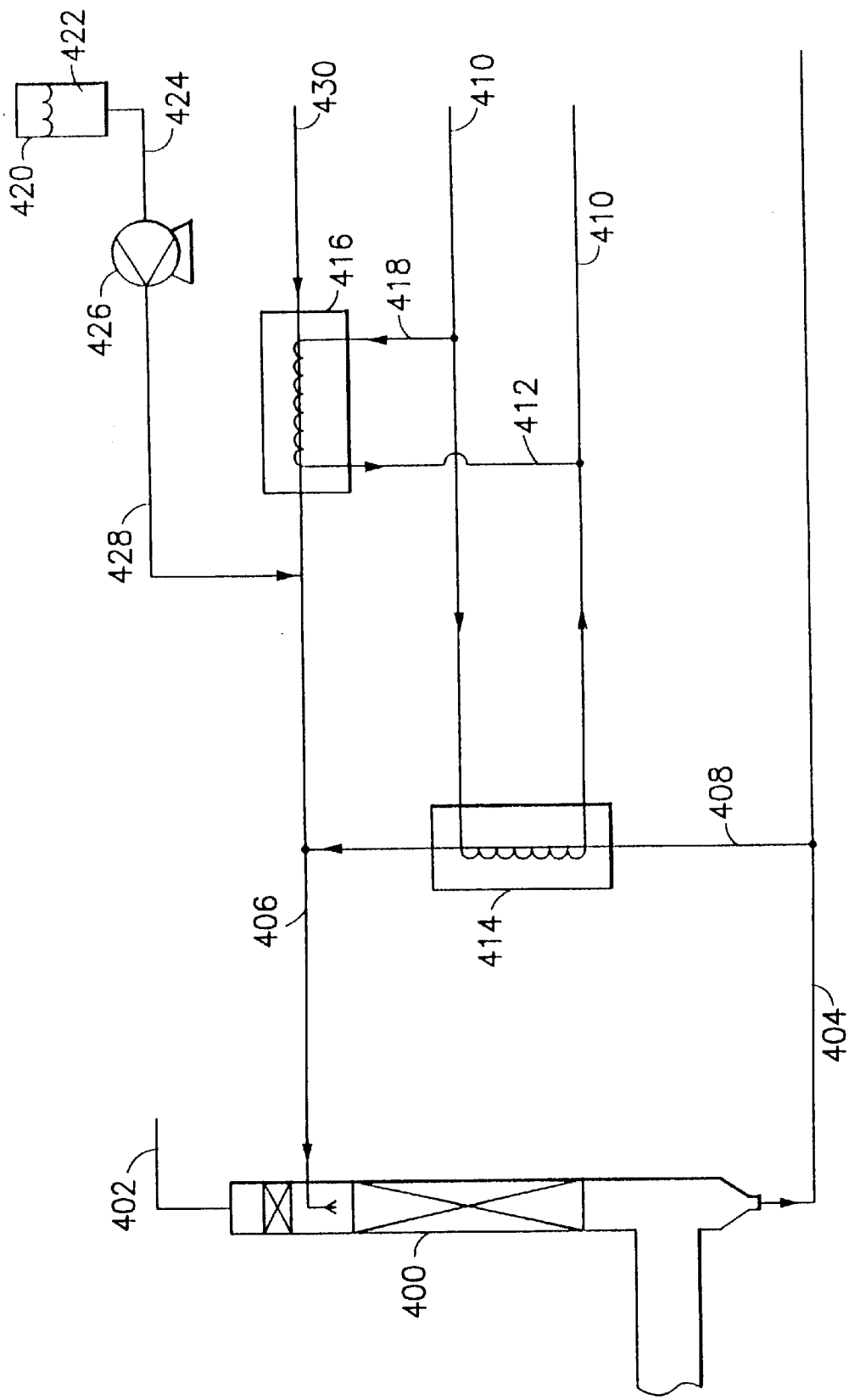
FIG. 6 is a schematic flowsheet of a process system similar to that illustrated in the FIG. 9 flowsheet, showing the modification thereof in accordance with a further aspect of the invention.
Figure 9:
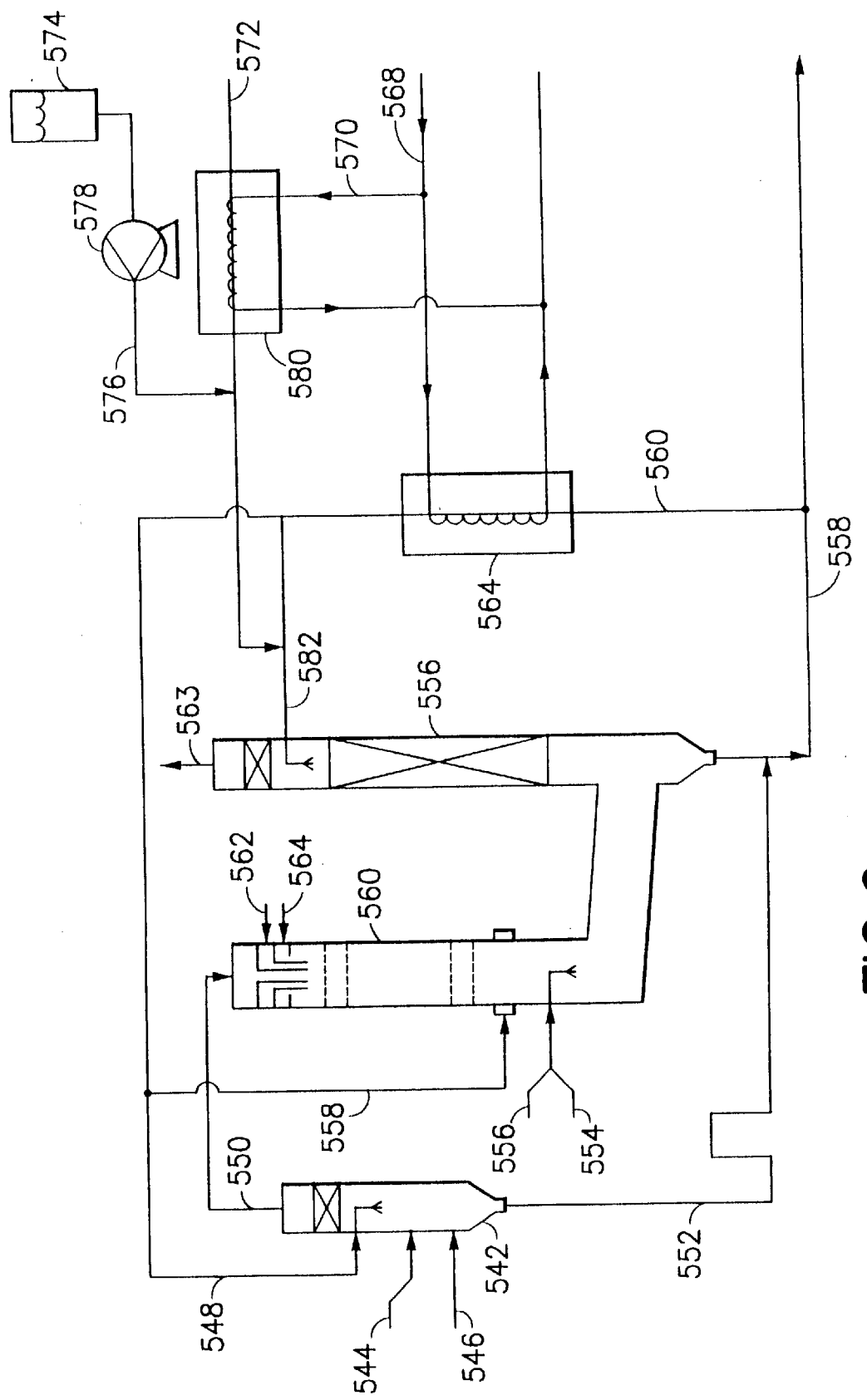

FIG. 6 is a schematic flowsheet of a process system similar to that illustrated in the FIG. 9 flowsheet, showing the modification thereof in accordance with a further aspect of the invention. In this FIG. 6 embodiment, the scrubber 400 discharges scrubbed overhead in line 402, and bottoms in line 404. A portion of the bottoms liquid may be recycled in line 408, heat exchanged in heat exchanger 414 by chilled water in line 410, and used as make-up for the scrubbing liquid comprising water introduced in line 430 and heat exchanged in heat exchanger 416 by chilled water flowing through lines 412 and 418 of main line 410. The resulting scrubbing liquid is further augmented by addition of liquid treating chemical 422 from vessel 420 pumped from line 424 by pump 426 to line 428 and joined with the scrubbing liquid from line 430 and passed in line 406 to the nozzle in the scrubber 400.

Figure 7:
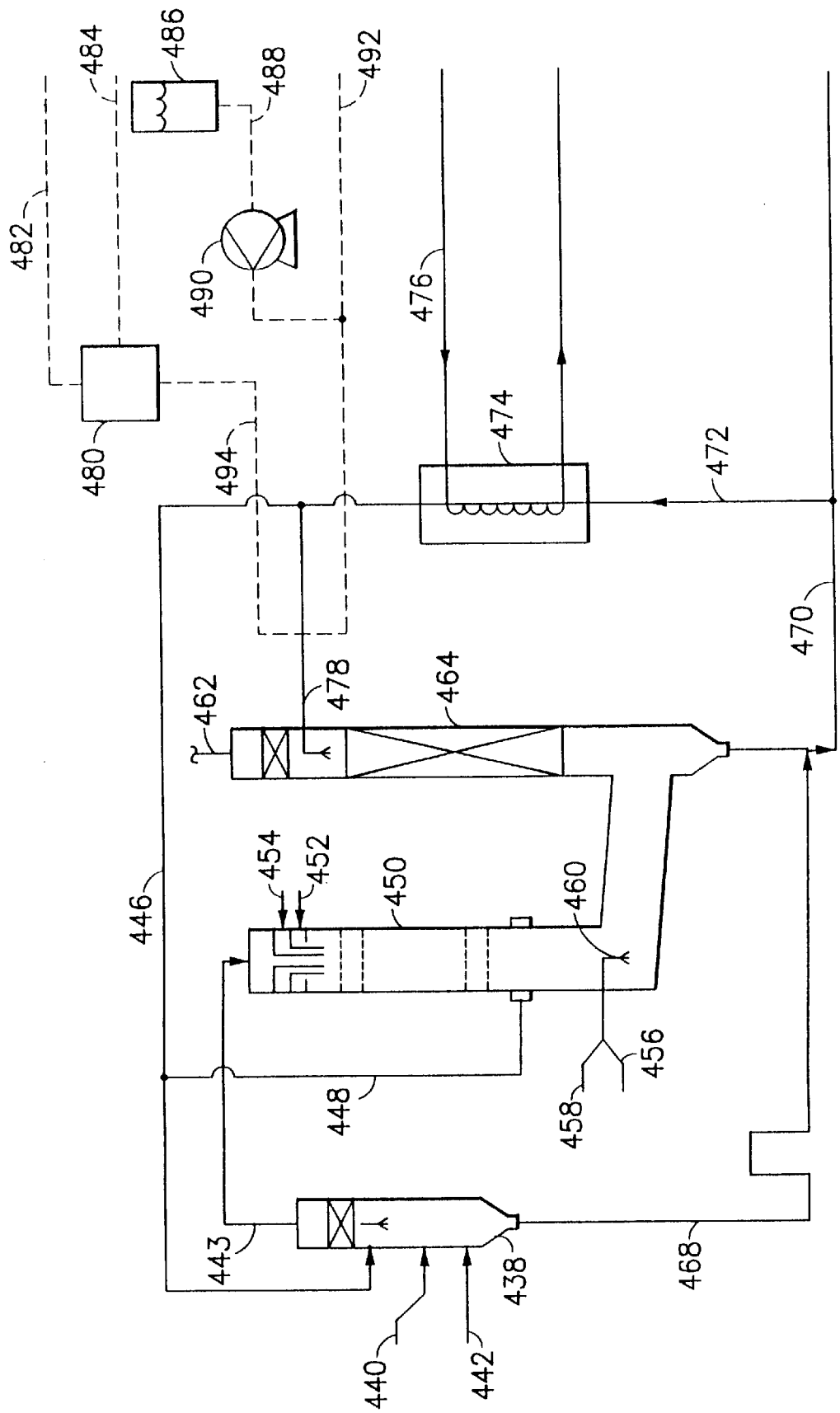
FIGS. 7, 8 and 9 are respective schematic flowsheets according to further aspects of the invention.
Figure 8:
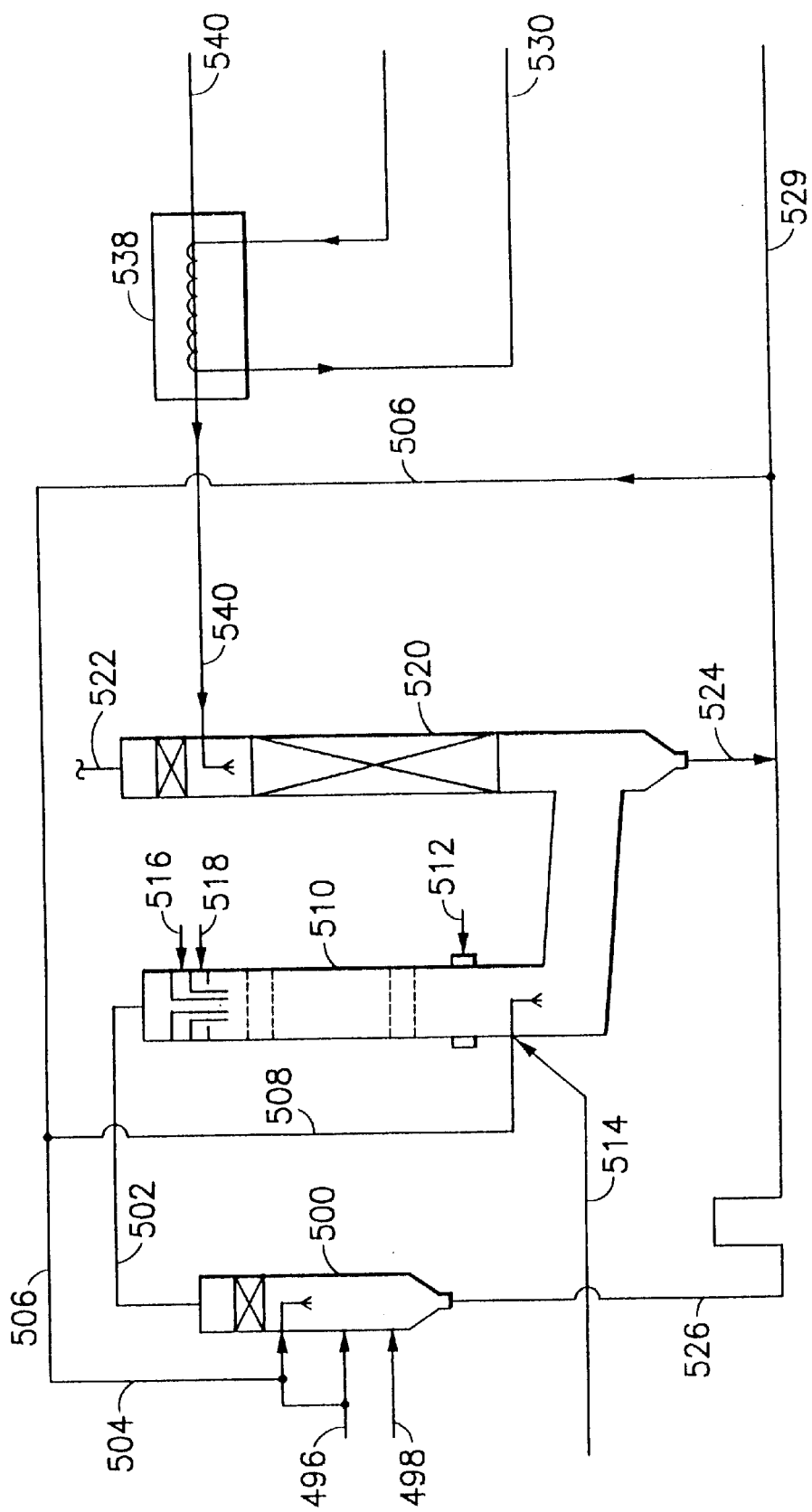

FIGS. 7, 8 and 9 are respective schematic flowsheets according to further aspects of the invention.

In FIG. 7, the fume is introduced in line 442 to pre-treatment column 438, along with water or water/nitrogen mixture in line 440, in which the fume is contacted with liquid from line 446, to produce overhead passed in line 443 to the oxidation reactor 450. The reactor receives oxygen in line 454 and nitrogen in line 452. The lower portion of the vessel containing reactor 450 is a quench section receiving recycle quench liquid in line 448, together with air in line 458 and water in line 456, for introduction in the quench section at nozzle 460.

The scrubber 464 is constructed as previously described, and receives scrubbing liquid in line 478 from recycle line 472, deriving from the bottoms of the pre-treatment column in line 468 and the scrubber bottoms combined therewith in line 470 as shown. The recycle liquid in line 472 may be heat exchanged in heat exchanger 474 by chilled water in line 476. Scrubbed effluent gas from scrubber 464 is discharged overhead on line 462.

The scrubbing liquid in line 478 may be augmented by addition thereto of chemical liquid from line 494. The chemical liquid for such purpose is made of water introduced to mixing vessel 480 in line 482 and dry chemical introduced to the vessel 480 in line 484. Alternatively, or additionally, liquid chemical in vessel 486 may be pumped in line 488 by pump 490 to line 492 in which the liquid chemical may be diluted with water introduced in such line. In this manner, the system shown in FIG. 7 is adapted to utilize wet or dry chemical addition in the scrubbing liquid, as may be necessary or desirable in a given end use application of the treatment system of the invention.

In FIG. 8, the effluent gas stream is introduced in line 498 to pre-treatment column 500, along with water or water/ nitrogen mixture in line 496. A portion of such fluid may be diverted in line 504, combined with recycle liquid from line 506, and passed to the nozzle in the pre-treatment vessel.

In pre-treatment column 500, the effluent gas stream is contacted with liquid, to produce overhead passed in line 502 to the reactor 510. The reactor receives oxygen in line 516 and nitrogen in line 518. The lower portion of the vessel containing reactor 510 is a quench section receiving recycle quench liquid in line 508, together with water in lines 512 and 514.

The scrubber 520 is constructed as previously described, and receives scrubbing liquid in line 540 after it is heat exchanged in heat exchanger 538 by chilled water in line 530. The scrubber bottoms in line 524 is combined with the pre-treatment column bottoms from line 526, and the combined stream in line 529 may be passed to effluent waste liquid treatment or other disposition, with a portion of the combined bottoms liquid being recycled in line 506.

Scrubbed effluent gas overhead is discharged from the scrubber in line 522.

In FIG. 9, the effluent gas stream is introduced in line 546 to pre-treatment column 542, along with water or water/nitrogen mixture in line 544, in which the effluent gas stream is contacted with liquid from line 548, to produce overhead passed in line 550 to the reactor 560. The reactor receives oxygen in line 562 and nitrogen in line 564. The lower portion of the vessel containing reactor 560 is a quench section receiving recycle quench liquid in line 558, together with air in line 556 and water in line 554, for introduction in the quench section at the nozzle interiorly disposed therein.

The scrubber 556 is constructed as previously described, and receives scrubbing liquid in line 582 from recycle line 560, deriving from the bottoms of the pre-treatment column in line 552 and the scrubber bottoms combined therewith in line 558 as shown. The recycle liquid in line 560 may be heat exchanged in heat exchanger 564 by chilled water in line 568.

A portion of the chilled water in line 568 is withdrawn in line 570 and passed to heat exchanger 580, for heat exchange with the scrubbing water introduced in line 572. Chemical additive may be added from reservoir 574 in line 576 under the action of pump 578, to augment the scrubbing water in line 572, for subsequent combination with recycle liquid from line 560, as mixed with the chemical/water solution in line 582 and subsequently introduced to the nozzle at the upper end of the scrubber 556. Scrubbing of the effluent gas stream thus is carried out to produce a scrubbed overhead discharged from the scrubber in line 562.

Figure 10:
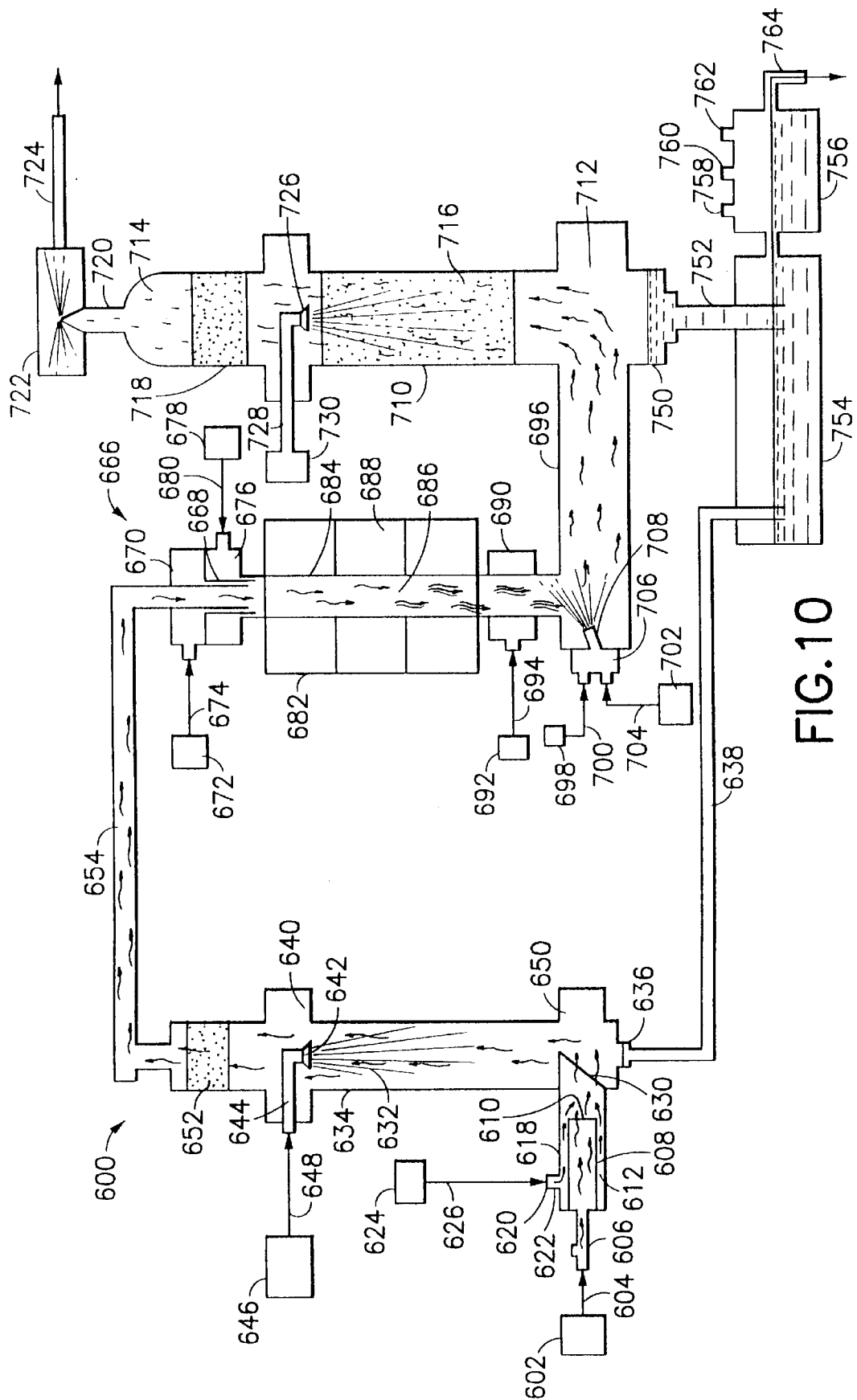
FIG. 10 is a schematic flow sheet of a gas effluent treatment system according to another embodiment of the invention, showing the gas/liquid interface inlet structure associated with the pre-scrub tower.

FIG. 10 is a schematic representation of an effluent gas treatment system 600 according to yet another embodiment of the invention, utilizing a pre-treatment unit, an oxidation unit, and a scrubber, wherein the scrubber and oxidation unit are coupled via a quench chamber.

The upstream process unit 602 discharges an effluent stream in line 604 which enters inlet 606 of the effluent gas treatment system. The inlet 606 is joined in gas flow communication with an inner tubular member 608 having an open discharge end 610. The tubular member 608 is concentrically arranged in outer tubular member 618, to provide an interior annular volume 612 therebetween. The outer tubular member 618 is provided with a gas inlet port 620 defined by tubular extension 622, to which gas from supply vessel 624 is suitably flowed to the tubular extension 622 in line 626 for flow through the interior annular volume 612 between the inner and outer tubular members, so that the effluent gas stream from the upstream process unit discharged at open discharge end 610 of the inner tubular member is sheathed in the gas supplied from gas supply vessel 624.

For purposes of modulating the flow of gas from gas supply vessel 624, line 626 may contain a flow control valve or other flow control means for effecting a predetermined flow rate of gas to the tubular extension 622.

The outer tubular member 618 of the inlet structure has a diagonally cut discharge end 630, which is arranged so that the maximum length circumferential portion of the outer cylindrical member 618 represented by cut discharge end 630 is above the minimum length circumferential portion of tubular member 618. In this manner, the maximum length circumferential portion serves as an "overhang" structure to permit development of the flow of the effluent gas stream, sheathed in the protective gas from gas supply 624, without premature contacting of such sheathed effluent gas stream with the down-falling liquid 632 in the pre-treatment tower 634.

Pre-treatment tower 634 is constructed as schematically shown, with a lower sump reservoir 636 providing for collection and drainage in conduit 638 of scrubbing liquid from the tower. The tower is constructed with an upper portion 640 in which is provided a spray nozzle 642 fed with pre-scrub liquid from conduit 644 supplied from liquid supply 646 and line 648 coupled to conduit 644. Line 648 may contain suitable flow control valves or other means for modulating the flow of pre-scrub liquid to tower 634. Thus, the effluent gas stream from the upstream process facility 602 is introduced through the inlet structure into the lower portion 650 of the tower 634, and countercurrently contacts the pre-scrub liquid 632 discharged from spray nozzle 642. The effluent gas stream thus is pre-scrubbed to remove particulates and acid components of the gas. The pre-scrubbed effluent gas then passes through the upper end of tower 634, passing through demister pad 652 to remove entrained water therefrom, with the demisted effluent gas mixture then passing in conduit 654 to the inlet unit 666, in which the conduit 654 is concentrically arranged with respect to a larger concentric conduit 668 communicating with plenum 670 receiving sheathing gas from gas source 672 through line 674. The outer conduit 668 in turn is circumscribed by a plenum 676 receiving oxidant medium, such as air or other oxygen-containing gas from oxidant medium supply 678 joined to plenum 676 by line 680. The line 674 and 680 may contain flow control valves or other flow control means therein, for modulating the flow of the respective gases. By such inlet structure 666, the effluent gas stream enters in conduit 654, is sheathed in nitrogen or other inert gas from supply 672, and is co-currently introduced to the oxidizer unit 682 with oxidizer medium from plenum 676 deriving from supply 678.

The oxidation unit 682 may be a multi-zone oxidation reaction chamber, with the gas flow passage 684 defining gas flow path 686 therein, circumscribed by heater 688. The heater 688 may be an electrothermal unit, or comprise any other suitable heating means, whereby the gas in gas flow path 686 is heated to suitably high temperature to effect oxidation of the oxidizable components in the gas stream.

The oxidized effluent gas stream then passes in conduit or gas flow passage 684 to a weeping weir gas/liquid interface structure 690 as described hereinafter in greater detail. The weeping weir gas/liquid interface structure receives liquid from liquid supply 692 via liquid feed line 694. The weeping weir gas/liquid interface acts to protect the lower walls of conduit 684 in proximity to the quench chamber 696, so that such interior wall surfaces of conduit 684 are isolated from hot, corrosive reaction products in the effluent gas stream treated in oxidation unit 682. Concurrently, the weeping weir gas/liquid interface structure supplies a falling film of water on such interior wall surfaces of conduit 684 below the interface structure 690, to entrain particulates and prevent their accumulation and coalescence on the interior wall surfaces of conduit 684.

In quench chamber 696, quench air is flowed from quench air supply 698 through line 700 to the quench chamber, concurrently with flow of quench water from water supply 702 through line 704 to mixing chamber 706, from which the resulting air/water stream is discharged in quench chamber 696 by nozzle 708, to effect quench cooling of the effluent gas stream.

The quenched effluent gas then flows into scrubber unit 710, from the lower portion 712 thereof to the upper portion 714 thereof, through packed bed 716 and demister pad 718, to produce a treated effluent gas stream which is discharged from the scrubber unit in overhead conduit 720 under the action of eductor 722, for final discharge from the effluent treatment system in discharge line 724.

The scrubber unit 710 has a spray nozzle 726 therein, supplied by feed conduit 728 with scrubbing medium from supply reservoir 730. The scrubbing medium may be water or other aqueous medium, optionally including chemical adjuvants for enhancing the scrubbing efficacy of the scrubber unit.

The quench chamber has a lower sump portion 750 for collection of quench liquid and scrubbing liquid therein, and flow in discharge conduit 752 to tank 754, which also receives bottoms liquid from the pre-treatment unit, in line 638. Such "bottoms liquid" from the process units in the effluent treatment system may be treated in tank 754, such as by addition of appropriate acid or base reagents in treatment tank 756, having ports 758, 760 and 762 for such purpose, whereby one or more treatment chemicals may be added, subsequent to which final treated liquid may be discharged from the system in discharge conduit 764.

Figure 11:
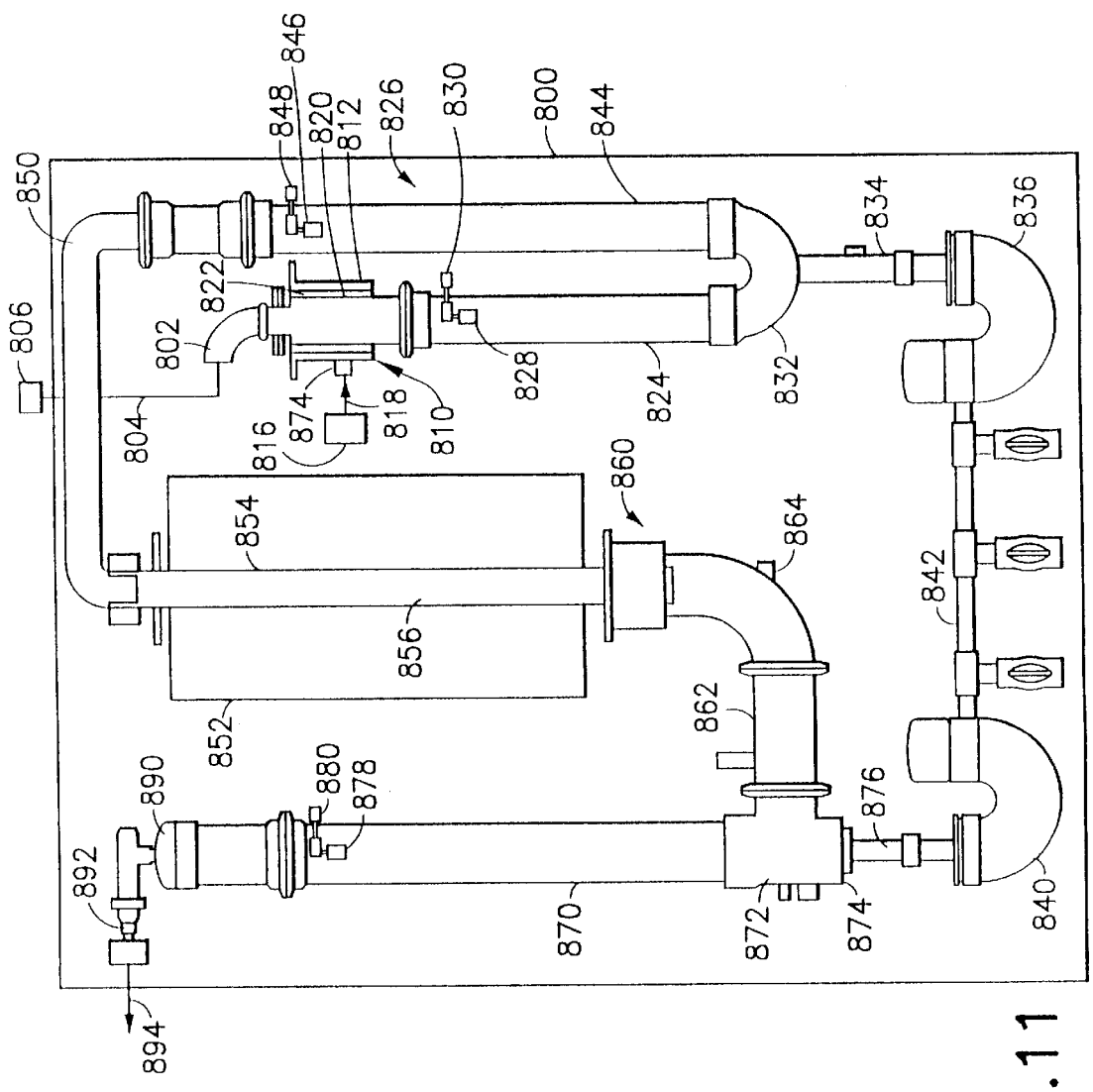
FIG. 11 is a schematic representation of another gas effluent treatment system according to the invention, schematically shown as being contained in a cabinet enclosure.

FIG. 11 is a schematic representation of a treatment system according to another embodiment of the present invention, schematically represented as being reposed within a cabinet 800.

The effluent gas stream treatment system of FIG. 11 features an effluent gas stream inlet conduit 802 receiving effluent from effuent feed line 804 transporting the effluent gas stream from an upstream process unit 806, such as a semiconductor manufacturing facility. The inlet conduit 802 communicates with a gas shrouding structure 810 comprising a cylindrical wall 812 having an inlet port 874 receiving gas from reservoir 816 in line 818. The wall 812 defines with interior gas permeable wall 820 an interior annular volume 822 from which gas introduced from reservoir 816 flows through the gas permeable wall 820 and shrouds the effluent gas flow stream being introduced from inlet conduit 802. The effluent gas flow stream then flows downwardly through a first leg 824 of the pre-treatment unit 826. The first leg 824 of the pre-treatment unit is provided with a spray nozzle 828 connected to a feed conduit 830 which in turn is joined to suitable sources of air and water (not shown). In such manner, the downwardly flowing effluent gas stream is contacted with the air/water spray to pre-treat the gas and reduce its acidity as well as to entrain particulates from the effluent gas stream in the aqueous phase being introduced from nozzle 828. The resulting liquid then collects in the lower U-shaped portion 832 of the pre-treatment unit and flows by conduit 834 to sump 836, communicating with sump 840 of the scrubber unit (hereafter more fully described) by means of the manifold conduit 842.

The effluent gas stream subsequent to contacting with the air/water spray in the first leg of the pre-treatment unit then flows upwardly through the second leg 844 of such unit, in which the effluent gas stream is countercurrently contacted with down-falling water spray from the nozzle 846 coupled by conduit 848 to a suitable source of liquid, e.g., water or other scrubbing medium (not shown). From the pre-treatment unit 826, the pre-treated effluent gas stream passes in conduit 850 to the thermal oxidation unit 852, comprising effluent gas flow pipe 854, through the interior volume 856 of which the effluent gas stream is flowed while being heated to sufficient temperature to oxidize and destruct deleterious oxidizable components of the gas stream. The oxidized effluent gas stream then is discharged from the thermal oxidation unit 852 to the weeping weir gas/liquid interface structure 860, as hereinafter more fully described, with the effluent gas stream then flowing in conduit 862, which constitutes a quench chamber equipped with feed port 864 for introduction of quench medium, such as water or an air/water spray, to the scrubber tower 870. The scrubber tower has a lower portion 872 including a bottoms reservoir 874 which drains accumulated liquid through drainpipe 876 to the sump 840, from which the liquid may be drained via the manifold 842 and associated drainpipes. The scrubber tower 870 is provided with a scrubber medium spray nozzle 878 at its upper portion, coupled via feed conduit 880 with a suitable source of scrubbing medium (not shown), which may comprise water or other aqueous or scrubbing medium. The scrubber tower suitably contains above nozzle 878 a demister or other liquid disentrainment means (not shown), for reducing the moisture or liquid content of the scrubbed gas. The scrubbed gas rises to the upper end 890 of the scrubber tower and is discharged in overhead conduit 892 through line 894, exteriorly of the effluent treatment system cabinet 800.

By the arrangement shown in FIG. 11, the effluent gas stream receives a binary scrubbing treatment upstream of the thermal oxidizer unit followed by downstream scrubbing of the effluent gas stream discharged from the thermal oxidation unit.

The thermal oxidizer unit may be of any suitable type, providing elevated temperature processing of the effluent gas stream, e.g., at temperatures up to 2000° F. or higher.

By providing the oxidation unit and the pre-treatment (i.e., pre-oxidation treatment) scrubbing and post-oxidation scrubbing units in a single unitary cabinet, a compact apparatus conformation is provided, having a small footprint, accommodating the deployment of the effluent gas stream treatment system conveniently within a semiconductor fabrication facility, or other process facility in which the effluent gas stream being treated by the system of the invention is located.

As mentioned, the scrubbing units in the effluent gas stream treatment system of the present invention may be replaced by other wet or dry scrubbers or other treatment units for removing particulates and acidic components, as well as other solubilizable or otherwise scrubbingly removable components from the effluent gas stream.

Figure 12:
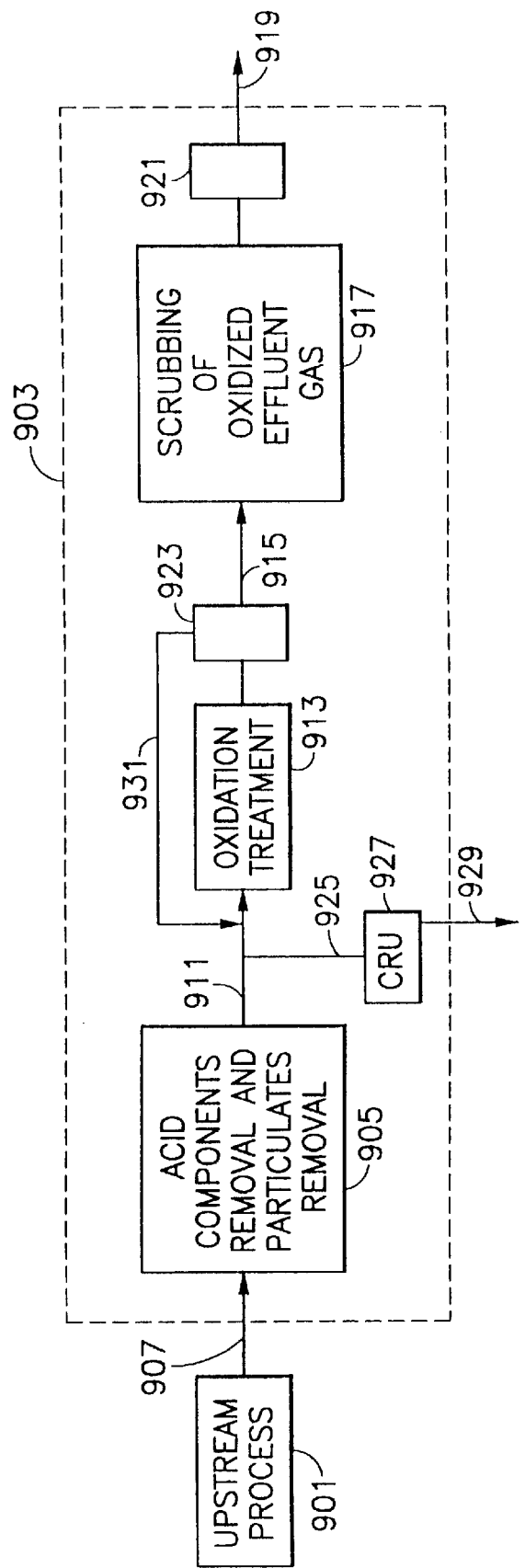
FIG. 12 is a schematic representation of a gas effluent treatment system according to another embodiment of the invention, showing various optional ancillary features thereof.

FIG. 12 is a schematic representation of a process system for treatment of effluent gas from an upstream process 901, which enters cabinet 903 in line 907 and is processed in treatment unit 905 for removal of acidic components and removal of particulate solids. The gas stream treated in treatment unit 905 then is flowed in line 911 to the oxidation treatment unit 913, in which the effluent gas stream is subjected to oxidation conditions for purification of the effluent gas stream by removing deleterious or undesired oxidizable components of the gas stream. The oxidized effluent gas then is flowed in line 915 to scrubbing unit 917 for scrubbing treatment of the gas to produce a final treated gas stream which is discharged from the effluent treatment system in line 919, under the impetus of the motive fluid driver 921. As mentioned, the motive fluid driver may be an active device such as a fan, pump, turbine, compressor, etc., or a passive device such as an eductor, aspirator, or the like.

The FIG. 12 effluent treatment system may further comprise a quench unit 923 for extracting the latent heat of the effluent gas stream subsequent to oxidation treatment thereof, and to cool the oxidation treatment effluent to an appropriate temperature for effective scrubbing in the scrubber unit 917.

The acidic components and particulates removal unit 905 may suitably comprise a pre-treatment subsystem for hydrogen fluoride absorption, dedicated to removal of such component.

The inlets of the respective treatment units in the effluent treatment system may suitably use wet/dry interface structures, such as a slit/hole inject type or porous type interface, to minimize water usage in the various treatment steps of the effluent treatment system.

The oxidation treatment unit 913 may comprise a shell and tube heat exchanger as the oxidation apparatus, which may utilize any suitable heating means or method. For example, radiative flux may be employed on the shell side of the heat exchanger, to heat the effluent gas to appropriate temperature for oxidation of the oxidizable components therein.

The post-oxidation scrubbing unit 917 may incorporate heat exchange means for cooling of the gas to restrict condensation and enhance the efficacy of the scrubbing process. Scrubbing operations in the effluent treatment system may be carried out in scrubber columns utilizing a demister mesh for de-entrainment of water in the scrubbed effluent gas stream. The overhead interior volume of the column may be provided as a void volume for enhancing the removal of particulate solids from the effluent gas stream.

As a further modification of the effluent gas stream treatment system of the present invention, the system may employ a halocarbon recovery unit 927 for recovery of chlorofluorocarbons, perfluorocarbons, etc. Such chloro/fluorocarbon recovery unit (CRU) may be constructed and operated as disclosed in co-pending U.S. patent application Ser. No. 08/395,162 of Glenn M. Tom, et al., filed Feb. 27, 1995 for "METHOD AND APPARATUS FOR CONCENTRATION AND RECOVERY OF HALOCARBONS FROM EFFLUENT GAS STREAMS" and U.S. patent application Ser. No. 08/474,517 of Glenn M. Tom, et al., filed Jun. 7, 1995 for "PROCESS FOR REMOVING AND RECOVERING HALOCARBONS FROM EFFLUENT PROCESS STREAMS," the disclosures of which hereby are incorporated herein by reference in their entirety. The halocarbon recovery unit 927 thus may receive effluent gas in line 925 from line 911 subsequent to scrubbing or other pre-oxidation treatment of the gas stream in treatment unit 905. The recovered halocarbon then is discharged from the CRU unit 927 in line 929, and may be recycled or otherwise utilized as desired. As a further alternative, the halocarbon may be recovered downstream of the oxidation treatment of the effluent gas stream.

The oxidation treatment unit 913 may as indicated comprise a heat exchanger, and such heat exchanger may utilize heat transfer enhancing inserts in heat transfer passages thereof, as more fully described in U.S. patent application Ser. No. 08/602,134, filed Feb. 15, 1996 in the names of Mark R. Hoist, et al., for "POINT-OF-USE CATALYTIC OXIDATION APPARATUS AND METHOD OF TREATMENT OF VOC-CONTAINING GAS STREAMS," the disclosure of which is hereby incorporated herein by reference in its entirety.

As a further modification of the effluent gas treatment system schematically shown in FIG. 12, a saturated water/exhaust stream from the quench unit 923 may be recycled in line 931 to the inlet of the oxidation unit 913, to provide a low cost hydrogen source for oxidation of perfluorocarbons, if destruction of perfluorocarbons is desired, rather than recovery thereof.

The pre-oxidation unit 905 may comprise a pre-scrubber to which chemicals may be introduced to alter the characteristics of materials being scrubbed, e.g., addition of ammonia to tungsten hexafluoride effluent, to yield ammonium tungstate. Ammonium tungstate has good solubility characteristics for scrubbing removal thereof.

The oxidation unit 913 may comprise a transportation tube reactor to eliminate wall accumulations of reactant/product solids in such step.

The quench unit 923 may utilize atomizing nozzles which employ multiple fluid inputs, e.g., of water and air or other gas, to reduce quench unit size. Such quench unit alternatively may comprise atomizing means such as ultrasonic nozzles, nebulizers, or petroelectric nozzles to effectuate the quenching operation.

The oxidation unit 913 may utilize electric thermal oxidation, or may otherwise affect oxidation through flame-based oxidation, as well as by any other suitable oxidation equipment and methods. The flame-based oxidation unit may utilize any suitable fuel, e.g., methane, propane, hydrogen, butane, etc., and the oxidizing medium employed in the oxidation unit, generally may comprise air, oxygen, oxygen-enriched air, or any other oxygen-containing medium. The oxidation unit may also comprise a fluidized bed thermal oxidizer unit, within the broad scope of practice of such treatment step.

As mentioned, the pre-oxidation treatment unit 905 and the post-oxidation treatment unit 917 may comprise scrubbers of any suitable type, wet as well as dry scrubbers, wet electrostatic precipitators, as well as any other suitable pre-oxidation and post-oxidation treatment means.

It will therefore be seen that the effluent gas stream treatment system of the present invention is adapted to be embodied in a wide variety of constituent treatment component configurations, and that such treatment units may be compactly embodied in a unitary cabinet or housing, for use in a process facility such as a semiconductor manufacturing plant.

In general, the treatment system of the present invention contemplates the use of gas/liquid and gas/gas interface structures for "shrouding" the effluent gas stream with a circumscribing layer or sheath of gas or liquid. Such sheathing of the effluent gas stream may be desired, for example, to protect containing walls of gas flow passages, in relation to solids accumulation and deposition which would occur in the absence of such sheathing of the gas stream, as well as entrainment, particularly in the case of sheathing liquid films, of particulates and solubilization of deleterious components from the gas stream.

Accordingly, illustrative types of interface structures are described hereafter, representing specific structural features and embodiments of such approach.

Figure 13:
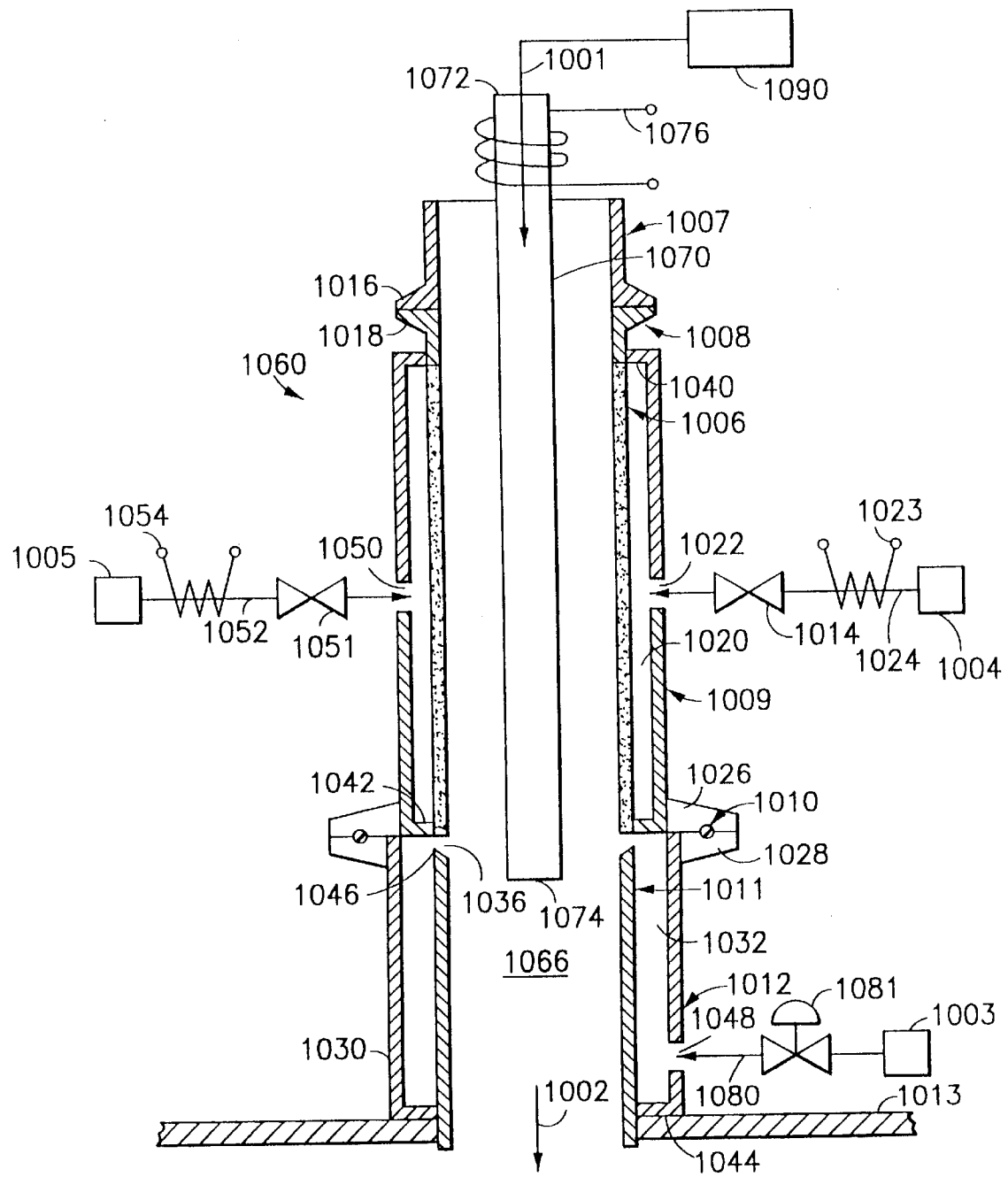
FIG. 13 is a schematic representation of a clogging-resistant inlet structure according to an illustrative embodiment of the present invention.

FIG. 13 is a schematic representation of a clogging-resistant inlet structure according to an illustrative embodiment of the present invention, as usefully employed in the effluent gas stream treatment system of the present invention.

The clogging-resistant inlet structure shown in FIG. 13 is connectable to process piping of the effluent gas stream treatment system, for a coupling such inlet structure with a source of the gas stream. The process system piping upstream of such inlet structure may be suitably heat-traced in a conventional manner, to add sufficient energy to the gas stream in the piping to prevent components of the gas stream from condensing or subliming in the inlet structure. It will be appreciated that any of the piping, conduits, flow passages or fluid-contacting structure in the treatment system of the present invention may be heat traced, for such purpose, or otherwise to improve the performance of the process system.

The inlet structure 1060 shown in FIG. 13 comprises an inlet section 1007 including an inlet flange 1016. The inlet flange is matably engageable with the flange 1018 of upper annular section 1008 which terminates at its upper end in such flange. The inlet section may be coupled with an upstream particulate solids-containing stream generating facility 1090, as for example a semiconductor manufacturing tool.

The annular section 1008 comprises an inner porous wall 1006 which is of appropriate porosity to be gas-permeable in character, and an outer solid wall 1009 defining an annular interior volume 1020 therebetween. The interior surface of the inner porous wall 1006 thus bounds the flow passage 1066 in the upper annular section 1008. The outer solid wall 1009 at its upper and lower ends is enclosed in relation to the inner wall 1006, by means of the end walls 1040 and 1042 to enclose the annular interior volume. The outer wall 1009 is provided with a low pressure gas inlet port 1022 to which is joined a low pressure gas feed line 1024. The low pressure gas feed line 1024 is connected at its outer end to a source 1004 of low pressure gas. A check valve 1014 is disposed in the low pressure gas feed line 1024 to accommodate the flow of low pressure gas into the annular interior volume 1020. The feed line 1024 may also be provided with other flow control means (not shown) for selectively feeding the low pressure gas from the source 1004 into the annular interior volume 1020 in a desired amount and at a desired flow rate, in the operation of the system.

The upper annular section 1008 also is provided with a high pressure gas injection port 1050 to which is joined high pressure gas feed line 1052 joined in turn to high pressure gas supply 1005. The gas feed line is shown with a flow control valve 1051 therein, which may be joined to flow controller means (not shown) for operating the flow control valve 1051 in accordance with a predetermined sequence.

The upper annular section 1008 terminates at its lower end in a flange 1026 which is matably engageable with flange 1028 of the lower annular section 1030. The flanges 1026 and 1028 may be sealed by the provision of a sealing means such as the O-ring 1010 shown in FIG. 13.

The lower annular section 1030 includes an outer wall 1012 terminating at its upper end in the flange 1028. The outer wall at its lower end is joined to the inner weir wall 1011 by means of the end wall 1044, to form an annular interior volume 1032 between the outer wall 1012 and the inner weir wall 1011. The inner weir wall 1011 extends vertically upwardly as shown but terminates at an upper end 1046 in spaced relation to the lower end of inner porous wall 1006 of upper annular section 1008, so as to form a gap 1036 therebetween defining an overflow weir for the lower annular section 1030.

The outer wall 1012 of the lower annular section 1030 is provided with a water inlet port 1048 to which may be joined a water feed line 1080 joined to water supply 1003 having liquid flow control valve 1081 therein which may be operatively coupled with other flow control means for maintaining a desired flow rate of liquid to the lower annular section 1030.

At its lower end, the lower annular section 1030 may be suitably joined to the housing of the water scrubber 1013. The water scrubber may be constructed in a conventional manner for conducting scrubbing abatement of particulates and solubilizable components of the process stream. Alternatively, the inlet structure 1060 may be coupled to any other processing equipment for treatment or processing of the gas stream passed through the inlet structure, from the inlet end to the discharge end thereof.

Thus, there is provided by the inlet structure 1060 a gas flow path 1066 through which influent gas may flow in the direction indicated by arrow "1001" in FIG. 13 to the discharge end in the direction indicated by arrow "1002" in FIG. 13.

In operation, particulate solids-containing gas is introduced from an upstream source, such as a semiconductor manufacturing tool (not shown) by means of suitable connecting piping, which as mentioned hereinabove may be heat-traced to suppress deleterious sublimation or condensation of gas stream components in the inlet structure. The stream enters the inlet structure 1060 in the flow direction indicated by arrow "1001" and passes through the inlet section 1007 and enters the upper annular section 1008. Low pressure gas, such as nitrogen, or other gas, is flowed from source 1004 through low pressure gas feed line 1024 connected to port 1022, and enters the annular interior volume 1020. From the annular interior volume 1020 the introduced low pressure gas flows through the gas-permeable wall 1006, into the interior gas flow passage 1066. The particulate-containing gas thus flows through the interior gas flow passage 1066 and into the water scrubber 1013, as the low pressure gas from gas feed line 1024 flows into the annular interior volume 1020 and through the gas-permeable wall 1006.

In this manner, the annular interior volume 1020 is pressurized with the low pressure gas from the source 1004. Such pressure ensures a low, steady flow of the low pressure gas through the porous wall into the interior gas flow passage 1066. Such low flow rate, steady flow of the gas through the gas-permeable wall maintains the particulates in the gas stream flowing through the interior gas flow passage 1066 away from the interior wall surfaces of the inlet structure. Further, any gases present with the gas flow stream in the interior flow passage 1066 are likewise kept away from the interior wall surfaces of the inlet structure.

The low pressure gas feed line 1024 can if desired be heat traced. Such heat tracing may be desirable if the gas stream flowing through the inlet structure contains species that may condense or sublimate and deposit on the walls of the inlet structure.

Concurrently, high pressure gas from high pressure gas supply 1005 may be periodically flowed through high pressure gas feed line 1052 through high pressure gas injection port 1050 to the annular interior volume 1020. For this purpose, the line 1052 may have a flow control valve (not shown) therein, to accommodate the pulsed introduction of the high pressure gas. In this manner, the high pressure gas is injected into the annular interior volume at specified or predetermined intervals, in order to break away any particle buildup on the inner surface of the gas permeable wall 1006. The duration and time sequencing of the pulsed introduction of the high pressure gas may be readily determined without undue experimentation within the skill of the art, to achieve the desired wall scouring effect which will prevent solids accumulation on the gas permeable wall surfaces. If required, when the inlet structure is employed in connection with a water scrubber servicing a semiconductor manufacturing tool, such high pressure injections may be interrupted during the tool batch cycle in order to eliminate pressure fluctuations at the tool exhaust port by suitable integration of control means operatively linked to the tool control system. For this purpose, a control valve such as a solenoid valve may be appropriately coupled with control means of the tool assembly.

In the inlet structure embodiment shown, the flanges 1026 and 1028 may be clamped to one another to permit quick disconnection of the upper annular section 1008 from the lower annular section 1030. For such purpose, a quick-disconnect clamp may be employed. The sealing gasket or O-ring 1010 between flanges 1026 and 1028 may be formed of a suitable material such as a corrosion resistant, high temperature elastomer material. This elastomeric gasket additionally functions as a thermal barrier to minimize heat transfer from the upper annular section to the lower annular section of the inlet structure, a feature which is particularly important in heat traced embodiments of the invention.

The gas permeable wall 1006 of the upper annular section of the inlet structure may be formed of any suitable material, e.g., a corrosion-resistant Hastelloy 276 steel. The outer wall 1009 of the upper annular section may be a thin walled stainless steel pipe.

The lower annular section 1030 of the inlet structure may be formed of any suitable material such as a polyvinylchloride plastic. Water is injected into the annular interior volume 1032 between the outer wall 1012 and the inner weir wall 1011 through line 1050 from water supply 1003. Preferably, the water is injected tangentially, to allow the angular momentum of the water in the annular interior volume 1032 to cause the water to spiral over the top end or upper end 1046 of the weir wall 1011 and down the interior surface of the weir wall in the interior flow passage 1066 of the inlet structure. Such water flow down the interior surface of the weir wall 1011 is employed to wash any particulates down the flow passage 1066 to the water scrubber 1014 below the inlet structure.

The pressure drop through the inlet structure can be readily determined by pressure tapping the exhaust pipe from the upstream process unit and the scrubber unit downstream of the inlet structure. The pressure drop can be monitored with a photohelic gauge and such pressure drop reading can be sent to suitable monitoring and control equipment to monitor clogging in the scrubber inlet.

By the use of the inlet structure in the system of the present invention, an interface may be provided between the water scrubber and the tool exhaust stream from a semiconductor manufacturing operation, that does not clog repeatedly in normal process operation. Such inlet structure provides an interface with two ancillary process streams, a steady low flow purge stream and a high pressure pulse stream. The low flow purge stream creates a net flux of inert gas, e.g., nitrogen, away from the inner surface of the upper annular section toward the centerline of the central flow passage 1066. The high pressure gas flow stream provides a self-cleaning capability against solids clogging. The high pressure gas flow is employed to eliminate any particle buildup on the inlet structure upper annular section interior surfaces of the central flow passage 1066.

Gases, entrained particles, and previously deposited particles are then directed into the overflow stream at the inner wall surface in the lower annular section of the inlet structure, to be flushed down into the water scrubber downstream of the inlet structure. In this manner a direct interface between the gas permeable wall of the upper annular section and the weir wall of the lower annular section of the inlet structure, providing a highly efficient inlet conformation which effectively minimizes the buildup of particulate solids in operation.

Such inlet structure has a number of advantages. In application to a semiconductor manufacturing facility and water scrubber treatment system for processing of waste gas effluents from a tool in the semiconductor process facility, the exhaust gas from the semiconductor tool can be heated continuously all the way from the tool exhaust port to the water interface in the water scrubber inlet structure. Heat tracing on the inlet lines can be used to heat the lines by conducting energy into the piping, which transfers energy to the flowing gas stream by convection. Process gas may be heated all the way down to the overflow weir wall of the lower annular section of the inlet structure by heat tracing the low pressure gas flow line which flows low pressure gas to the upper annular section, as well as by heat tracing the high pressure gas flow line feeding pulsed high pressure gas to the interior annular volume of the upper annular section of the inlet structure. Such flow of heated gas will maintain the process gas flowing through the central flow passage of the inlet structure at a temperature which is determined by the vapor pressure of any particulate forming gas in the gas stream flowing to the inlet structure from the upstream process unit that would otherwise condense or sublimate and deposit on the walls of the inlet structure.

Another advantage of the above-identified inlet structure is that such structure may be readily dissassembled. In the event that the inlet structure does clog in operation, the structure is easily taken apart by simply removing the clamps or other securement elements holding the flanges of the inlet structure to one another. The upper annular section may thus be replaced by removing the clamps holding the respective flanges in position, and by disconnecting the respective gas feed lines that feed the upper annular section.

A still further advantage of such inlet structure is that it is self-cleaning in character. Particles that have been entrained in the gas stream flowing to the inlet structure from the upstream process unit or that have been formed by chemical reaction in the inlet structure can be readily cleaned from the gas-permeable wall of the inlet structure by the pulsed high pressure gas injection into the interior annular volume in the upper annular section of the inlet structure. The particles that are then dislodged from the interior wall surfaces of the upper annular section of the inlet structure then are directed to the overflow portion of the weir wall where such particulate solids are flushed to the downstream scrubber. The pressure, duration and periodicity of the high pressure gas pressure pulses can be easily set to accommodate the prevailing system particulate concentration conditions and character of such solids. The effectiveness of the pulsed high pressure gas injection will depend on the character of the particulate solids. Such inlet structure therefore is self-cleaning in nature, without the use of scraper or plunger devices typical of the so-called self-cleaning apparatus of prior art fluid treatment systems.

The material specification of the porous wall element of the upper annular section of the inlet structure is dependent on the incoming process gas from the upstream process unit. If the gas stream includes acid gas components, such gases will be absorbed in the water scrubber and will be present in water which is recirculated to the overflow weir wall in the lower annular section of the inlet structure. It is possible that some of the overflow weir wall water will splash up on the porous inner wall of the upper annular section of the inlet structure. The porous wall in such instance is desirably selected from corrosion-resistant materials of construction. A preferred metal material for such purpose is Hastelloy 276 steel, which exhibits excellent corrosion resistance under low temperature hydrous acid conditions.

Another advantage of the above-described inlet structure is that it minimizes the backflow of water vapor from the top of the water scrubber when the inlet structure is employed upstream of a water scrubber as illustratively described herein. By way of explanation of this advantage, it is to be appreciated that particulates may be present in the exhaust streams of some semiconductor tools as either entrained particulates from the process tool or as the reactants of a chemical reaction within the gas stream's flow path.

The reason for this particulate buildup is the occurrence of water vapor backstreaming from the water scrubber downstream from the inlet structure. Water vapor released from the scrubber migrates back from the scrubber inlet toward the process tool, against the normal direction of gas flow.

One mechanism involved in this back-migration of water vapor is gas-gas interdiffusion. The only practical way of avoiding this source of water vapor back migration is to add a diffusion boundary to the water scrubber inlet. Another mechanism for such back-diffusion of water vapor is the so-called Richardson annular effect, All dry pumps create a certain amount of pressure oscillation in the gas flow stream. These pressure oscillations create a counterflow transport mechanism that pumps gases against the direction of normal gas flow. This phenomenon is a consequence of the boundary layer annular effect. Because of this effect, the backflow migration velocity is greatest a small distance away from the wall surface. The above-described inlet structure minimizes or eliminates the Richarson annular effect. Due to the steady outflow of low pressure gas at the inner surface of the porous wall of the upper annular section of the inlet structure, the static boundary layer condition at the inner wall surface of the upper annular section cannot develop. There is a net flux of flowing gas from the gas-permeable wall which acts to "push" the process gas flow away from the wall bounding the central flow passage of the inlet structure, and avoids the presence of a static boundary condition, thereby avoiding the Richardson annular effect. Accordingly, if particles are formed as a result of chemical reaction in the flow stream, the thus-formed particles do not find a wall to agglomerate on. The particles instead will flow with the gas stream into the water scrubber. The same is true for entrained particles. Once the particles reach the top of the inlet, they will become entrained in the gas flow stream because they will not have a wall on which to collect.

By opposing the conditions which give rise to the Richardson annular effect, the porous wall in the upper annular section of the inlet structure serves as an effective barrier to the back migration of water vapor to the exhaust lines of the process system. Any back migration will be exceedingly slow due to the aforementioned interdiffusion mechanism. This factor will greatly increase the mean time to failure for the scrubber, since the scrubber entry and exhaust lines will not clog as often with the inlet structure of the present invention.

Although the porous wall member of the upper annular section of the inlet structure of the invention has been described herein as being constructed of a metal material, it will be appreciated that such gas-permeable wall may be formed of any suitable material of construction. For example, the porous wall may be formed of a porous ceramic material having the capability to withstand the corrosive atmospheres, temperature extremes, and input pressures that may be present in the use of the inlet structure of the present invention.

Figure 14:
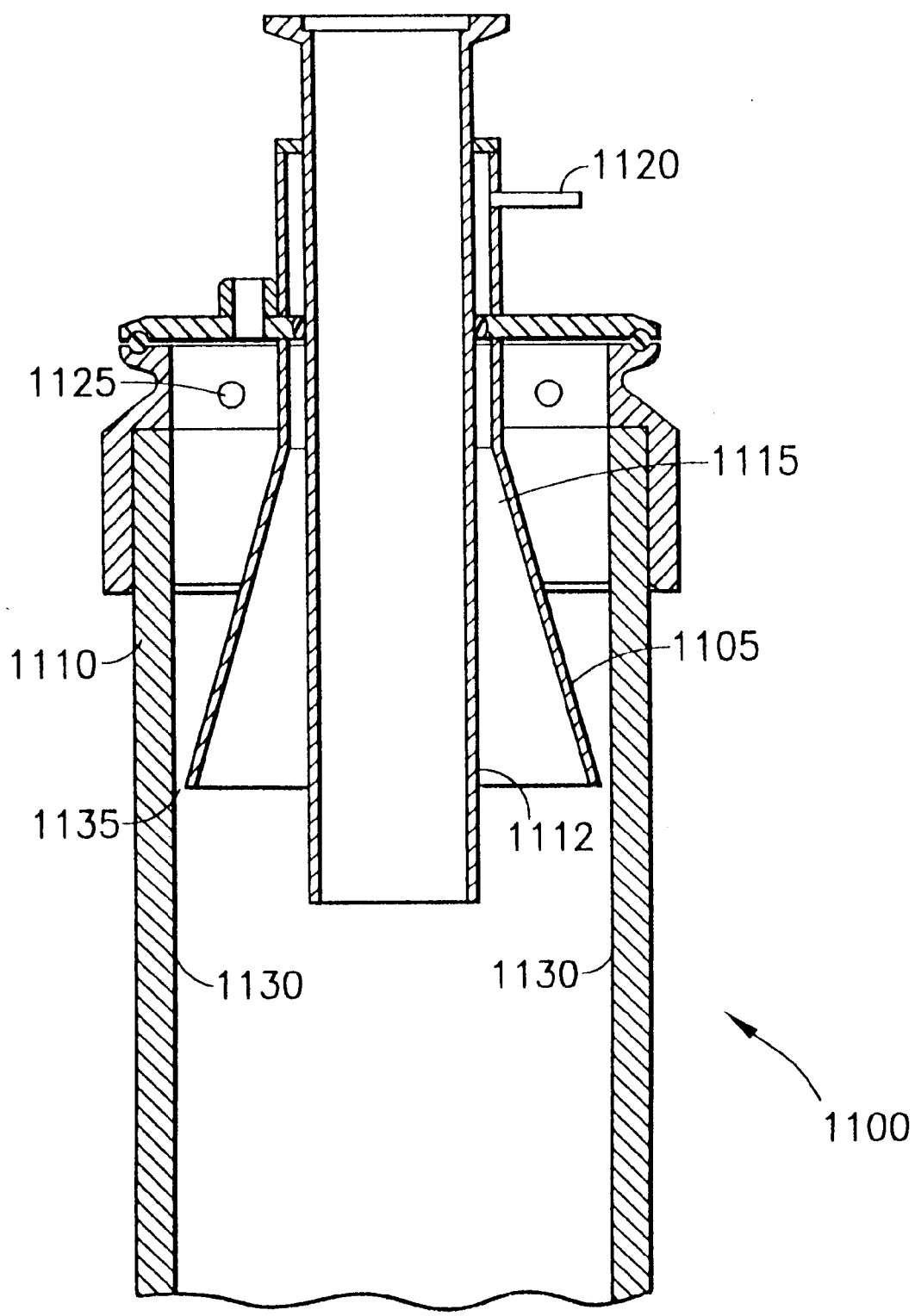
FIG. 14 is a schematic cross-sectional elevation view of a gas/liquid interface structure in accordance with another illustrative embodiment of the invention.

FIG. 14 is a schematic cross-sectional elevation view of a gas/liquid interface structure which may be utilized in the practice of the present invention.

The gas/liquid interface structure 1110 includes a first vertically extending inlet flow passage member 1112 defined by a cylindrical elongate wall 1114. The cylindrical wall 1114 circumscribes an enclosed flow passage 1118 within the inlet flow passage member 1112. At an upper end of cylindrical wall 1114 there is provided a radially outwardly extending flange 1116 for joining the gas/liquid interface structure to associated process flow piping, conduits, instrumentation, etc. The first inlet flow passage member 1112 thus has an inlet 1120 at its upper end, and a corresponding outlet 1122 at its lower end, so that the open inlet and outlet ends define with the interior volume a flow path including flow passage 1118, through which gas from an upstream process unit 1158 may be flowed as in line 1160 illustratively shown in FIG. 14.

The upstream process unit 1158 may for example comprise a semiconductor manufacturing tool and associated effluent gas treatment apparatus. Such effluent treatment apparatus may in turn comprise an oxidizer for oxidation of oxidizable components in the effluent gas. Suitable oxidizers are of widely varying type, and may for example be constituted by a catalytic oxidation unit, a thermal oxidation unit, an electrothermal oxidizer, etc.

When the upstream process unit 1158 comprises gas generating means and gas treatment means for semiconductor manufacturing operations, the gas stream introduced to inlet 1120 of the first inlet flow passage member 1112 may be at elevated temperature and may contain substantial concentration of particulate solids, e.g., in the form of sub-micron size particles.

The interface structure 1110 further comprises a second flow passage member 1124 which circumscribes the first flow passage member 1112 and is in spaced relationship thereto, as shown, to define an annular volume 1130 therebetween. The second flow passage member 1124 extends downwardly to a lower end 1168 below the lower end of the first flow passage member 1112, so that the open outlet 1122 of the first flow passage member is in vertically spaced relationship to the open lower end 1168 of the second flow passage member 1124.

The second flow passage member 1124 comprises an upper liquid-permeable portion 1126 elevationally above the lower end defining outlet 1122 of the first flow passage member, with a remaining liquid-impermeable portion 1128, extending downwardly from the liquid-permeable portion 1126, as illustrated. The liquid-permeable upper portion 1126 and lower liquid-impermeable portion 1128 may be formed in any suitable manner, as for example by joining of an upper porous cylindrical segment 1126 to an initially separate lower solid-walled cylindrical segment 1128, with the respective portions being joined to one another by brazing, soldering, welding, mechanical fastener securement, or in any other suitable manner with appropriate joining means and method. Alternatively, the second flow passage member 1124 may be formed from a unitary cylindrical tubular member, an upper part of which is rendered liquid-permeable in character by processing, such as water-jet machining, etching, sintering, micro-electromachining, or any other suitable technique by which porosity or permeability characteristics can be imparted to the upper portion of such tubular member. Preferably, the second flow passage member is formed of initially separate upper and lower portions which are joined together and wherein the upper portion is constituted by a porous sintered metal matrix, or a porous ceramic material, wherein the porosity is of sufficient dimensional character to allow liquid permeation therethrough, as subsequently described hereafter in greater detail.

The gas/liquid interface structure 1110 further comprises an outer wall member 1134 enclosingly circumscribing the second flow passage member and defining therewith an enclosed interior annular volume 1170. The outer wall member 1134 comprises a cylindrical side wall 1136, a top end wall 1138 and a bottom end wall 1140, which corporately enclose the interior annular volume 1170. The side wall 1136 is provided with a liquid introduction port 1142. The port may be provided in any suitable manner, but in the embodiment shown is constituted by tubular horizontal port extension 1144. Alternatively, the port may simply be an orifice or opening in the side wall, or other liquid inlet structure, whereby liquid can be introduced into the interior annular volume 1170 from an external liquid supply.

In the FIG. 14 embodiment, the liquid inlet port 1142 is coupled with liquid introduction line 1146 containing flow control valve 1148 therein. The liquid inlet line 1146 is connected to liquid supply reservoir 1150.

The liquid flow control valve 1148 in line 1146 may be coupled to suitable controller/timer means, including a central processing unit (CPU), microprocessor, flow control console, and/or ancillary monitoring and control means, for providing a predetermined or otherwise selected flow of liquid from reservoir 1150 through line 1146 to liquid inlet port 1142. The thus-introduced liquid fills the interior annular volume 1170, and such liquid may be introduced at any suitable process conditions.

For processing of gas streams such as hot particulate-laden effluent gas streams from semiconductor manufacturing operations, the liquid in interior annular volume 1170 may be water or other aqueous media.

By virtue of the liquid-permeable character of the upper liquid permeable portion 1126 of the second flow passage member 1124, liquid from interior annular volume 1170 permeates through the upper portion 1126 of the second flow passage member and is expressed at the inner wall surface 1132 of such upper portion as liquid droplets 1154. Such issuing liquid droplets, as a result of gravitational effect, fall and coalesce with other liquid droplets and aggregate to form a downwardly flowing liquid film 1156 on the inner wall surface 1172 of the lower liquid-impermeable portion of the second flow passage member. The liquid in the liquid film discharging from the lower open end 1168 of the second flow passage member may be directed to suitable collection and processing means (not shown) e.g., for co-processing thereof in a downstream process unit 1164 to which the gas stream is flowed from gas flow passage 1152 of the second flow passage member in line 1162. The downstream process unit 1164 may be a water scrubber, reaction chamber, or other processing apparatus or treatment zone, in which the gas stream flowed from passage 1152 in line 1162 is subjected to further process operations, with discharge of final effluent gas from the downstream process unit in line 1166.

The gas/liquid interface structure 1110 thus is constructed to provide an interior annular volume 1130 between the first and second flow passage members, and with the first flow passage member 1112 extending downwardly below the liquid-permeable upper portion 1126 of the second flow passage member, so that liquid weeping through the liquid-permeable upper portion can coalesce and develop the falling liquid film 1156. By this arrangement, the gas flowed from flow passage 1118 to flow passage 1152 encounters an interior wall surface 1172 of the lower portion of the second flow passage member, which is blanketed with a protective liquid film 1156. Accordingly, any corrosive species in the gas discharged from the lower open end 1122 of the first flow passage member will be "buffered" in relation to the inner wall surface, to minimize corrosion and adverse reaction effects on such interior wall surface of the second flow passage member.

Further, by introduction of liquid to the interior annular volume 1170 between the second flow passage member and the outer wall member 1134, there is provided a liquid reservoir "jacket" structure. Liquid thereby is provided to the porous upper portion of the second flow passage member, for permeation therethrough, and downward "weeping" of liquid to form a protective film on the interior wall surface of the second flow passage member.

Such falling film on interior surface 1172 of the second flow passage member also serves to entrain and to carry away any particulates from the gas stream which in the absence of such liquid film might deposit on and aggregate on the interior wall surface of the second flow passage member.

Accordingly, the falling liquid film affords a protective function with respect to the interior wall surface of the second flow passage member, as well as an entrainment medium which carries away particulate solids and any other gas phase components, which otherwise would be deleterious in accumulation on the interior wall surface of the flow passage member.

As a further advantage of this structure illustratively shown in FIG. 14, the use of a liquid permeable upper portion 1126 serves to minimize liquid usage, relative to the provision of a structure such as a liquid overflow weir, in which liquid from the interior annular volume 1170 would simply overflow an upper end of wall 1126 and flow downwardly in a film on the wall, over the full interior surface length of the second flow passage member. The liquid required for operation thereby is maintained at a very low level by the weeping weir structure of the present invention.

As an illustrative example of the implementation of the gas/liquid interface structure illustratively shown in FIG. 14, such structure may be employed downstream of a thermal oxidizer unit processing effluent gases from semiconductor manufacturing operations, so that the gas stream in line 1160 entering the interface structure 1110 is at elevated temperature and laden with particulates, such as silica, particulate metals, and the like, as sub-micron size particles or even larger solids. In such embodiment, the upper portion 1126 of the second flow passage member may be constituted by a sintered metal wall having a thickness on the order of $\frac{1}{16}$th inch, with an average pore size of about 2 microns. The length of the first flow passage member 1112 may be on the order of 48 inches, with a diameter on the order of 2.5 inches. The corresponding second flow passage member 1124 may correspondingly have a length on the order of 13.5 inches, with a diameter on the order of 4.5 inches, and the outer wall member 1134 may have a vertical length on the order of 5.5 inches, with a diameter on the order of 6 inches.

In such system, water may be employed as the liquid medium from reservoir 1150 which is introduced into interior annular volume 1170 for weep-through of such liquid onto the interior surface 1132 of the upper liquid permeable portion 1126 of the second flow passage member. The usage of water in such system may be on the order of 0.1–0.3 gallon per minute of operation.

While the invention has been described with reference to illustrative embodiments, it will be recognized that other variations, modification and other embodiments are contemplated, as being within the spirit and scope of the invention, and therefore the invention is to be correspondingly broadly construed with respect to such variations, modifications and other embodiments, as being within the spirit and scope of the invention as claimed.

What is claimed is:

1. An effluent gas stream treatment system comprising:
   a pre-treatment unit for reducing acid gas concentration and particulate components of an effluent gas stream entering the treatment system, the pre-treatment unit comprising a scrubber;
   an oxidation treatment unit arranged to receive the effluent gas stream having reduced acid gas concentration and particulate components from the pre-treatment unit, and to oxidize at least a portion of oxidizable components of the effluent gas stream;
   a post-oxidation treatment unit arranged (i) to receive the effluent gas stream from the oxidation treatment unit, and (ii) to scrub the effluent gas stream for enhancement of the character of the effluent gas stream for final discharge from the treatment system; and
   a clog-resistant inlet structure for introducing the effluent gas stream to the pre-treatment unit of said effluent-gas stream treatment system, said clog-resistant effluent gas stream inlet structure comprising a generally vertically arranged flow passage, for flowing the effluent gas stream containing particulate solids downwardly therethrough, said flow passage including a bounding wall having a weir opening therein, and an annular liquid supply reservoir circumscribing and in liquid feed relationship to the weir opening, with means for supplying liquid to the annular liquid supply reservoir for flow through the weir opening; and
   whereby when liquid is flowed into the annular liquid supply reservoir, the introduced liquid flows through the weir opening and flows down the bounding wall of the flow passage to wash any particulate solids from the wall and to suppress the deposition or formation of solids on the interior surface of the bounding wall, as the effluent gas stream containing particulate solids is flowed through the flow passage of the inlet structure.

2. An effluent gas stream treatment system according to claim 1, wherein at least one of the oxidation and post-oxidation treatment units includes an effluent gas stream inlet structure for shrouding the effluent gas stream introduced to the unit, with a fluid shrouding medium.

3. An effluent gas stream treatment system according to claim 2, wherein the gas stream inlet structure comprises a means for emitting a gaseous medium for shrouding the effluent gas stream.

4. An effluent gas stream treatment system according to claim 2, wherein the gas stream inlet structure comprises a means for emitting a liquid medium for shrouding the effluent gas stream.

5. An effluent gas stream treatment system according to claim 1, wherein the pre-treatment unit comprises a wet scrubber lower in which the effluent gas stream is contacted with the aqueous medium.

6. An effluent gas stream treatment system according to claim 5, wherein water is the aqueous medium.

7. An effluent gas stream treatment system according to claim 5, wherein the aqueous medium comprises a chemical reactant.

8. An effluent gas stream treatment system according to claim 1, wherein the pre-treatment unit comprises a gas inlet in which the effluent gas stream at its introduction to the pre-treatment unit is passed through a gas-shrouding structure surrounding the gas inlet, the gas-shrouding structure emitting a shrouding gas to shroud the entering effluent gas stream.

9. An effluent gas stream treatment system according to claim 8, wherein the oxidation treatment unit comprises a gas inlet for introduction of the effluent gas stream into the oxidation treatment unit, wherein the gas inlet includes a gas-shrouding structure upstream of the oxidation treatment unit, arranged to emit shrouding gas to shroud the effluent gas stream prior to oxidation treatment thereof.

10. An effluent gas stream treatment system according to claim 1, further comprising a gas transport structure downstream of the oxidation treatment unit and means for forming a liquid-shroud barrier between the effluent gas stream and gas transport structure to reduce clogging in the gas transport structure.

11. An effluent gas stream treatment system according to claim 1, wherein the post-oxidation treatment unit comprises a packing therein and a nozzle for spraying the aqueous medium into the effluent gas stream, for enhanced gas/liquid contacting.

12. An effluent gas stream treatment system according to claim 11, wherein the post-oxidation treatment unit comprises a demister structure above the nozzle in an upper portion of the post-oxidation treatment unit.

13. An effluent gas stream treatment system according to claim 1, comprising a quench unit downstream of the oxidation treatment unit, and means for recycling a saturated water stream from the quench unit to the oxidation treatment unit, to enhance oxidation in the oxidation treatment unit of perfluorocarbons that are present in the effluent gas stream.

14. An effluent gas stream treatment system according to claim 1, wherein the oxidation treatment unit comprises an electrothermal oxidation apparatus.

15. An effluent gas stream treatment system according to claim 1, wherein the oxidation treatment unit comprises a flame-based oxidation apparatus wherein the effluent gas stream is contacted with a flame under oxidation conditions.

16. An effluent gas stream treatment system according to claim 1, wherein the oxidation treatment unit comprises a fluidized bed thermal oxidizer apparatus including a fluidized bed of oxidation treatment material through which the effluent gas stream is flowed.

17. An effluent gas stream treatment system according to claim 1, wherein the oxidation treatment unit comprises a heat exchanger.

18. An effluent gas stream treatment system according to claim 17, wherein the heat exchanger comprises a heat transfer enhancement insert in a passage thereof.

19. An effluent gas stream treatment system according to claim 1, wherein the pre-treatment unit, oxidation treatment unit and post-oxidation treatment unit are contained in a unitary cabinet structure.

20. An effluent gas stream treatment system according to claim 1, comprising a fluid motive driver downstream of the post-oxidation treatment unit.

21. An effluent gas stream treatment system according to claim 20, wherein the fluid motive driver comprises a pump.

22. An effluent gas stream treatment system according to claim 20, wherein the fluid motive driver comprises an eductor.

23. An effluent gas stream treatment system according to claim 1, wherein the pre-treatment unit comprises means for addition of chemical to the effluent gas stream, to reactively form a reaction product with elevated solubility for scrubbing removal thereof, and the effluent gas stream subsequent to such chemical addition and reaction is subjected to wet scrubbing.

24. An effluent gas stream treatment system according to claim 1, wherein the pre-treatment unit comprises a U-shaped housing including first and second leg portions thereof joined to one another by a transverse yoke portion, wherein the first leg portion includes water spray means for contacting the effluent gas stream with sprayed water to reduce acidity and entrain particulates of the effluent gas stream, the second leg portion includes water spray means for further contacting the effluent gas stream with sprayed water, and the transverse yoke portion constitutes a collection reservoir for water sprayed into contact with the effluent gas stream in the first and second leg portions.

25. An effluent gas stream treatment system according to claim 1, wherein the oxidation treatment unit is a transpirative oxidation treatment unit.

26. An effluent gas stream treatment system according to claim 1, wherein the quench chamber is constructed and arranged to contact the effluent gas stream discharged from the oxidation treatment unit with a caustic solution to effect removal of silica particles from the effluent gas stream.

27. An effluent gas stream treatment system, comprising:
   a pretreatment unit for pretreating an effluent gas stream, to remove at least part of corrosive gases and particulate components of the effluent gas stream, and thereby enhance its character for subsequent oxidation treatment;
   an oxidation unit arranged to receive a pretreated effluent gas stream from the pretreatment unit, and to oxidize at least a portion of oxidizable components of the pretreated effluent gas stream to yield an effluent gas stream of reduced oxidizable components concentration;
   a post-oxidation treatment unit arranged to receive the effluent gas stream of reduced oxidizable components concentration from the oxidation unit, said post-oxidation treatment unit comprising a scrubber for contacting the effluent gas stream of reduced oxidizable components concentration with a scrubbing medium to remove scrubbable components from the effluent gas stream of reduced oxidizable components concentration and enhance the character of the effluent gas stream of reduced oxidizable components concentration for final discharge from the treatment system;
   wherein at least one of the pretreatment, oxidation and post-oxidation units includes an inlet structure for shrouding the effluent gas stream introduced to the unit, with a fluid shrouding medium;
   wherein said inlet structure comprises a gas/liquid interface structure including:
      a first vertically extending inlet flow passage member having an upper entrance for introduction of said effluent gas stream and a lower end for discharge of said effluent gas stream;
      a second flow passage member circumscribing the first flow passage member and in spaced relationship thereto, to define an annular volume therebetween, said second flow passage member extending downwardly to a lower end below the lower end of the first flow passage member, and said second flow passage member having an upper liquid-permeable portion elevationally above the lower end of the first flow passage member and a lower liquid-impermeable portion below said upper liquid-permeable portion;
      an outer wall member enclosingly circumscribing the second flow passage member and defining therewith an enclosed interior annular volume; and
      a liquid flow inlet port in the outer wall member for introducing liquid into the enclosed interior annular volume between the second flow passage member and the outer wall member.

28. An effluent gas stream treatment system according to claim 27, wherein the upper liquid-permeable portion of the second flow passage member comprises a porous cylindrical wall member.

29. An effluent gas stream treatment system according to claim 28, wherein the porous cylindrical wall member is formed of a sintered material.

30. An effluent gas stream treatment system according to claim 27, wherein the upper liquid-permeable portion of the second flow passage member is formed of a porous ceramic material.

31. An effluent gas stream treatment system according to claim 27, wherein the liquid-permeable portion is constituted by a porous wall having an average pore size in the range of from about 0.5 to 30 microns.

32. An effluent gas stream treatment system according to claim 27, wherein the first and second flow passage members are each cylindrical in character and coaxial with each other.

33. An effluent gas stream treatment system according to claim 27, wherein the outer wall member enclosingly circumscribing the second flow passage member comprises a cylindrical sidewall in radially spaced relationship to the second flow passage member, a top end wall through which the first liquid flow passage member extends, and a bottom end wall between the second flow passage member and a sidewall of the outer wall member.

34. An effluent gas stream treatment system comprising:
   a pretreatment unit for pretreating an effluent gas stream, to remove at least part of corrosive gases and particulate components of the effluent gas stream, and thereby enhance its character for subsequent oxidation treatment;
   an oxidation unit arranged to receive a pretreated effluent gas stream from the pretreatment unit, and to oxidize at least a portion of oxidizable components of the pretreated effluent gas stream to yield an effluent gas stream of reduced oxidizable components concentration;
   a post-oxidation treatment unit arranged to receive the effluent gas stream of reduced oxidizable components concentration from the oxidation unit, said post-oxidation treatment unit comprising a scrubber for contacting the effluent gas stream of reduced oxidizable components concentration with a scrubbing medium to remove scrubbable components from the effluent gas stream of reduced oxidizable components concentration and enhance the character of the effluent gas stream of reduced oxidizable components concentration for final discharge from the treatment system;
   wherein at least one of the pretreatment, oxidation and post-oxidation units includes an inlet structure for shrouding the effluent gas stream introduced to the unit, with a fluid shrouding medium;
   wherein the inlet structure comprises a clog-resistant inlet structure for introducing a particulate solids-containing effluent gas stream to the unit, said inlet structure comprising:
      first and second generally vertically arranged flow passage sections in serial coupled relationship to one another, defining in such serial coupled relationship a generally vertical flow passage through which the particulate solids-containing effluent gas stream may the flowed to the unit;
      said first flow passage section comprising an upper section of the inlet structure and including an inner gas-permeable wall having an interior surface bounding an upper part of the flow passage, and an outer wall enclosingly surrounding the gas-permeable wall to define an interior annular volume therebetween;

a low pressure gas flow port in the outer wall of the first flow passage section, said low pressure gas flow port being coupleable to a source of low pressure gas for flowing of low pressure gas at a predetermined flow rate into the interior annular volume, for subsequent flow of low pressure gas from the interior annular volume into the vertical flow passage of the inlet structure;

a high pressure gas flow port in the outer wall of the first flow passage section, said high pressure gas flow port being coupleable to a source of high pressure gas for flowing of high pressure gas into the interior annular volume, to clean the gas-permeable wall of particulates depositing or forming thereon;

the second flow passage section being serially coupled to the first flow passage section, for flowing particulate solids-containing effluent gas stream downwardly into the second flow passage section from the first flow passage section, said second flow passage including an outer wall having a liquid injection port therein, said second flow passage section outer wall being coupled with the first flow passage section, and an inner weir wall in spaced apart relationship to the outer wall to define an interior annular volume therebetween, with the inner weir wall extending toward but terminating short of the gas-permeable wall of the first flow passage section, to provide a gap therebetween defining a weir, and with said weir wall having an interior surface bounding the flow passage in the second flow passage section;

whereby when liquid is flowed into the interior annular volume between the outer wall of the second flow passage section and the inner weir wall thereof, the introduced liquid overflows the weir and flows down the interior surface of the inner wall of the second flow passage section to wash any particulate solids from the wall and to suppress the deposition or formation of solids on the interior surface of the inner weir wall, as the particulate solids-containing effluent gas stream is flowed through the flow passage of the inlet structure.

35. An effluent gas stream treatment system according to claim 34, wherein a lower end of the second flow passage section is joined to a water scrubber for scrubbing of the particulate solids-containing gas stream flowed through the flow passage of the inlet structure.

36. An effluent gas stream treatment system according to claim 34, wherein the first and second flow passage sections are disconnectably coupled to one another.

37. An effluent gas stream treatment system according to claim 34, wherein the first flow passage section is of cylindrical shape.

38. An effluent gas stream treatment system according to claim 34, wherein the first flow passage section and second flow passage section are coaxially aligned with one another.

39. An effluent gas stream treatment system according to claim 34, wherein the gas permeable wall is formed of a porous metal material.

40. An effluent gas stream treatment system according to claim 34, wherein the gas permeable wall is formed of a porous ceramic.

41. An effluent gas stream treatment system according to claim 34, wherein the gas permeable wall and outer wall of the first flow passage section are of circular cross-section.

42. An effluent gas stream treatment system according to claim 34, wherein the outer wall and inner weir wall of the second flow passage section are of circular cross-section.

43. An effluent gas stream treatment system according to claim 34, wherein the first flow passage section is joined to an upstream particulate solids-containing gas stream supplying means.

44. An effluent gas stream treatment system, comprising:

a pretreatment unit for pretreating an effluent gas stream, to remove at least part of corrosive gases and particulate components of the effluent gas stream, and thereby enhance its character for subsequent oxidation treatment;

an oxidation treatment unit arranged to receive a pretreated effluent gas stream from the pretreatment unit, and to oxidize at least a portion of oxidizable components of the pretreated effluent gas stream to yield an effluent gas stream of reduced oxidizable components concentration;

a post-oxidation treatment unit arranged (i) to receive the effluent gas stream of reduced oxidizable components concentration from the oxidation treatment unit, and (ii) to further remove corrosive gas and/or particulate components of the effluent gas stream of reduced oxidizable components concentration, for enhancement of the character of the effluent gas stream of reduced oxidizable components concentration for final discharge from the treatment system; and a clog-resistant inlet structure for introducing an effluent gas stream containing particulate solids to at least one treatment unit of said effluent gas stream treatment system, said clog-resistant effluent gas stream inlet structure comprising a generally vertically arranged flow passage, for flowing the effluent gas stream containing particulate solids downwardly therethrough, said flow passage including a bounding wall having a weir opening therein, and an annular liquid supply reservoir circumscribing and in liquid feed relationship to the weir opening, with means for supplying liquid to the annular liquid supply reservoir for flow through the weir opening;

whereby when liquid is flowed into the annular liquid supply reservoir, the introduced liquid flows through the weir opening and flows down the bounding wall of the flow passage to wash any particulate solids from the wall and to suppress the deposition or formation of solids on the interior surface of the bounding wall, as the effluent gas stream containing particulate solids is flowed through the flow passage of the inlet structure.

45. An effluent gas stream treatment system according to claim 44, further comprising means for gas shrouding a portion of the bounding wall above the weir opening.

46. An effluent gas stream treatment system, comprising:

A pretreatment unit for reducing acid gas concentration and particulate components of an effluent gas stream entering the treatment system from an upstream process, the pretreatment unit comprising a co-current and counter-current wet scrubber having a U-shaped conformation, including a first leg of said U-shaped conformation defining a co-current wet scrubber section, a second leg of said U-shaped conformation defining counter-current wet scrubber section, and a transverse bottom section of said U-shaped conformation communicating between said co-current wet scrubber section and said counter-current wet scrubber section, including means for first co-currently contacting the effluent gas stream with an aqueous medium in the co-current wet scrubber section and means for subsequently counter-currently contacting the effluent gas stream with an aqueous medium in the counter-current wet scrubber seciton after flow of the effluent gas stream through the co-current wet scrubber section and transverse bottom section, to produce an effluent gas stream having reduced acid gas concentration and particulate components;

an oxidation treatment unit arranged to receive the effluent gas stream having reduced acid gas concentration and particulate components from the pre-treatment unit, and to oxidize at least a portion of oxidizable components of the effluent gas stream;

a quench chamber arranged to receive the effluent gas stream after oxidation treatment thereof in the oxidation treatment unit, and to cool the effluent gas stream;

a post-treatment unit arranged (i) to receive the effluent gas stream from the quench chamber, and (ii) to scrub the effluent gas stream with an aqueous medium to further remove corrosive gas and/or particulate components of the effluent gas stream, for enhancement of the character of the effluent gas stream for final discharge from the treatment system; and a sump tank in liquid flow communication with the pre-treatment unit, the quench chamber and the post-oxidation treatment unit, and arranged for receiving aqueous media from the co-current and counter-current wet scrubbers, the quench chamber and the post-treatment wet scrubber, and for discharging aqueous media from the effluent treatment system.

47. An effluent gas stream treatment system according to claim 46, further comprising an eductor arranged to receive the effluent gas stream from the post-oxidation treatment unit and to discharge the effluent gas stream from the effluent treatment system.

48. An effluent gas stream treatment system according to claim 46, wherein each of the pre-treatment unit co-current and counter-current wet scrubber and the post-oxidation treatment unit comprises an atomizer for providing the aqueous medium in an atomized form, to minimize aqueous medium consumption.

49. An effluent gas stream treatment system according to claim 46, comprising a unitary cabinet structure containing said pre-treatment unit, oxidation treatment unit, quench chamber, post-oxidation treatment unit, and sump tank.

* * * * *

UNITED STATES PATENT AND TRADEMARK OFFICE
CERTIFICATE OF CORRECTION

PATENT NO : 5,955,037

DATED : Sept. 21, 1999

INVENTOR(S) :   Mark Holst; Kent Carpenter; Scott Lane; Prakash V. Arya

It is certified that error appears in the above-identified patent and that said Letters Patent are hereby corrected as shown below:

| | |
|---|---|
| Column 30, line 9: | after "flowed" insert --,--. |
| Column 33, line 2: | after "system insert --,--. |
| Column 33, line 18: | change "effluent-gas" to --effluent gas--. |
| Column 33, line 52: | change "lower" to --tower--. |
| Column 33, line 53: | after "with" delete "the" |
| Column 34, line 44: | after "a" insert --fluid--. |
| Column 36, line 65: | change "the" to --be--. |

Signed and Sealed this

Tenth Day of April, 2001

Attest:

NICHOLAS P. GODICI

Attesting Officer     Acting Director of the United States Patent and Trademark Office